US012751073B2

(12) United States Patent
Lee

(10) Patent No.: US 12,751,073 B2
(45) Date of Patent: Sep. 29, 2026

(54) VERTICAL THIN FILM TRANSISTOR WITH DUAL GATE ELECTRODES

(71) Applicant: Solsona Enterprise, LLC, San Diego, CA (US)

(72) Inventor: Chong Uk Lee, Carlsbad, CA (US)

(73) Assignee: Solsona Enterprise, LLC, San Diego, CA (US)

( * ) Notice: Subject to any disclaimer, the term of this patent is extended or adjusted under 35 U.S.C. 154(b) by 450 days.

(21) Appl. No.: 18/541,460

(22) Filed: Dec. 15, 2023

(65) Prior Publication Data

US 2024/0113191 A1 Apr. 4, 2024

Related U.S. Application Data

(60) Continuation-in-part of application No. 17/453,045, filed on Nov. 1, 2021, which is a continuation-in-part (Continued)

(51) Int. Cl.

*H10D 64/27* (2025.01)
*H10D 30/00* (2025.01)

(Continued)

(52) U.S. Cl.

CPC ......... *H10D 64/519* (2025.01); *H10D 30/501* (2025.01); *H10D 30/502* (2025.01);

(Continued)

(58) Field of Classification Search

CPC .......... H10D 30/501–504; H10D 30/506–509; H10D 30/6704; H10D 30/6728;

(Continued)

(56) References Cited

U.S. PATENT DOCUMENTS

| | | | |
|---|---|---|---|
| 4,470,059 | A | 9/1984 | Nishizawa et al. |
| 2006/0208251 | A1 | 9/2006 | Yoshizawa |

(Continued)

OTHER PUBLICATIONS

Li, et al.; "High Speed Circuit with Bulk Accumulation Mode a-IGZO TFTs"; 2014 21st International Workshop on Active-Matrix Flatpanel Displays and Devices (AM-FPD); Jul. 2014; pp. 137-139.

(Continued)

*Primary Examiner* — Marcos D. Pizarro

(74) *Attorney, Agent, or Firm* — Lipsitz & McAllister, LLC

(57) ABSTRACT

A dual gate vertical TFT is provided, comprising a substrate layer, a first layer stack and a second layer stack. The first layer stack comprises a first conductor layer deposited on the substrate layer forming a source electrode, a first insulator layer deposited on the first conductor layer forming a mid-gate, and a second conductor layer deposited on the first insulator layer forming a drain electrode. The layers of the first layer stack are patterned to expose at least portions of the first conductor layer, the first insulator layer, and the second conductor layer. The second layer stack may comprise a semiconductor layer making electrical contact with the source and drain electrodes, forming a substantially vertical channel across the mid-gate, a second insulator layer forming a top-gate insulator, and a third conductor layer forming a top-gate electrode. The layers of the second layer stack are patterned to form a top-gate.

17 Claims, 28 Drawing Sheets

VTFT Type-I Dual Active Gates
Mid-Gate: oxide/conductor/oxide

Related U.S. Application Data of application No. 17/302,769, filed on May 12, 2021, now Pat. No. 11,881,515, which is a division of application No. 16/397,341, filed on Apr. 29, 2019, now Pat. No. 11,049,948.

(60) Provisional application No. 63/477,239, filed on Dec. 27, 2022, provisional application No. 63/198,992, filed on Nov. 30, 2020, provisional application No. 63/198,774, filed on Nov. 12, 2020, provisional application No. 62/691,795, filed on Jun. 29, 2018.

(51) Int. Cl.

| | |
|---|---|
| ***H10D 30/67*** | (2025.01) |
| ***H10D 64/23*** | (2025.01) |
| ***H10D 64/66*** | (2025.01) |
| ***H10D 64/68*** | (2025.01) |

(52) U.S. Cl.

CPC ......... *H10D 30/503* (2025.01); *H10D 30/504* (2025.01); *H10D 30/506* (2025.01); *H10D 30/507* (2025.01); *H10D 30/508* (2025.01); *H10D 30/509* (2025.01); *H10D 30/6704* (2025.01); *H10D 30/6728* (2025.01); *H10D 30/6729* (2025.01); *H10D 30/673* (2025.01); *H10D 30/6733* (2025.01); *H10D 30/6734* (2025.01); *H10D 30/674* (2025.01); *H10D 30/6757* (2025.01); *H10D 64/252* (2025.01); *H10D 64/2523* (2025.01); *H10D 64/2527* (2025.01); *H10D 64/258* (2025.01); *H10D 64/512* (2025.01); *H10D 64/518* (2025.01); *H10D 64/66* (2025.01); *H10D 64/68* (2025.01); *H10D 30/6736* (2025.01)

(58) Field of Classification Search

CPC ............ H10D 30/6729; H10D 30/673; H10D 30/6733; H10D 30/6734; H10D 30/6736; H10D 30/674; H10D 30/6757; H10D 64/252; H10D 64/2523; H10D 64/2527; H10D 64/258; H10D 64/512; H10D 64/518; H10D 64/519; H10D 64/66; H10D 64/68

See application file for complete search history.

(56) References Cited

U.S. PATENT DOCUMENTS

| | | | |
|---|---|---|---|
| 2019/0393222 | A1 | 12/2019 | Sharma et al. |
| 2020/0044095 | A1 | 2/2020 | Wang et al. |
| 2020/0098930 | A1 | 3/2020 | Le et al. |

OTHER PUBLICATIONS

Baek, et al.; "Electrical Properties and Stability of Dual-Gate Coplanar Homojunction DC Sputtered Amorphous Indium-Gallium-Zinc-Oxide Thin-Film Transistors and Its Application to AM-OLEDs"; IEEE Transactions on Electron Devices, vol. 58, No. 12; Dec. 2011; pp. 4344-4353.

Dollinger, et al.; Vertical Organic Thin-Film Transistors with Anodized Permeable Base for Very Low Leakage Current; Advanced Materials, Mar. 2019, pp. 1-17.

Fan, et al.; "A Self-Aligned a-IGZO Thin-Film Transistor Using a New Two-Photo-Mask Process with a Continuous Etching Scheme"; Materials 2014, Aug. 11, 2014; pp. 5761-5768.

Kim, et al.; "Improvement in Device Performance of Vertical Thin-Film Transistors Using Atomic Layer Deposited IGZO Channel and Polyimide Spacer"; IEEE Electron Device Letters, vol. 38, No. 10, Oct. 2017; pp. 1387-1389.

Kleemann, et al.; "A Review of Vertical Organic Transistors"; Advanced Functional Materials, vol. 30, Issue 20, 2020, 23 pages.

VTFT Type-I Dual Active Gates
Mid-Gate: oxide/conductor/oxide

VTFT Type-I Passive Top Gate
Top-Gate: oxide (electret)

VTFT Type-I Passive Mid Gate
Mid-Gate: oxide (electret)

VTFT Type-I Passive Mid Gate
Partial source etching

VTFT Type-I Passive Mid-Gate
Partial source etching
Multiple insulators for Mid-Gate and Top-Gate Single Gate
Does not turn off
at zero Gate voltage Dual Gate (drive both gates)
Higher on-current
On at zero Gate voltage Dual Gate (bias one gate)
Turn on/off at zero Gate voltage Dual Gate (over bias one gate)
Turn on at high Gate voltage (Cut A)

(Cut A)

(Cut B)

(Cut A)

(Cut B)

FIG. 21c (Cut B)

FIG. 21b (Cut A)

VERTICAL THIN FILM TRANSISTOR WITH DUAL GATE ELECTRODES

This application claims the benefit of U.S. provisional patent application No. 63/477,239 filed on Dec. 27, 2022 and is a continuation-in-part of commonly-owned co-pending U.S. application Ser. No. 17/453,045 filed on Nov. 1, 2021, which claims the benefit of U.S. provisional patent application No. 63/198,774 filed on Nov. 12, 2020 and U.S. provisional patent application No. 63/198,992 filed on Nov. 30, 2020 and which is a continuation-in-part of U.S. application Ser. No. 17/302,769 filed on May 12, 2021, which is a divisional of U.S. application Ser. No. 16/397,341 filed on Apr. 29, 2019, which claims the benefit of U.S. provisional patent application No. 62/691,795 filed on Jun. 29, 2018. Each of the foregoing applications are incorporated herein and made a part hereof by reference.

BACKGROUND OF THE INVENTION

The present invention relates to the field of thin film transistors (TFTs). More specifically, the present invention relates to a vertical-structure TFT (also referred to herein as a vertical TFT or VTFT) having a dual gate electrode structure fabricated having a substantially vertical channel formed inside a via hole or on an outside of the layer stack. Corresponding methods of producing such a vertical TFT are also provided.

Conventional TFTs have a planar Source-Drain structure. The Source and the Drain contact/electrode are laterally arranged, with an active semiconducting material in between the Source and Drain. The Gate metal-oxide-semiconductor (MOS) structure is vertically arranged. The Gate electrode that controls the flow of electrons or holes between the laterally arranged Source and Drain contacts thru the semiconductor material. Such a structure is easy to build using a thin film deposition and etching/lift-off process. The carriers (electrons or holes) move between the Source and the Drain in a thin layer, forming a 2-D sheet channel layer that is typically less than tens of nanometers thick.

For example, wide bandgap metal oxide semiconductor (typically bandgap >3.0 eV) based TFTs are promising for low-cost, flexible, wearable and disposal device applications because of their features such as low temperature processability and compatibility with a wide variety of low-cost deposition processes, including solution-based processes. However, the typical transistor mobility is only about 10 $cm^2/Vs$ in such a standard TFT device with a lateral active channel with a typical length of about 5-20 microns (i.e., effective channel length). Therefore, the controllable drain current is limited to the level of mA. Typical TFT dimensions are as follows: approximately 50 nm-thick Source and Drain electrodes; approximately 150 nm-thick Gate oxide; approximately 50 nm-thick channel layer; and approximately 50 nm-thick gate electrode. Therefore, a typical aspect ratio of the vertical/lateral dimensions is approximately 300 nm/10000 nm.

FIG. 1A shows a typical prior art oxide-TFT structure with a lateral active channel (typically, the channel length is about 5-20 microns, and the channel width is about 10-20 microns) having a bottom-gate structure, while FIG. 1B shows a typical prior art oxide-TFT structure with a lateral active channel having a top-gate structure. Current flows from drain to source laterally in both structures (electron moves from source to drain.)

Thin Film Transistors, especially those fabricated for flat panel display (FPD, i.e., LCD, OLED, etc.), typically have relatively large feature dimensions, in the order of a few micrometers or larger. The distance between the source and the drain is relatively large, sometimes several micrometers or more. The longer the channel length between the source and the drain is, the longer the distance the current carriers have to travel. Therefore, the resulting transistor switches slowly. In many cases, the channel length is limited by the fineness of the patterning process, either by photo lithography or printing, or other patterning methods. On the other hand, the thickness of the layers, as the thin film process implies, can be much smaller in dimension. That is, the thickness of the individual layers can be as thin as the deposition process can produce, limited by the uniformity of the film that is laid down. Often times, this thickness can be controlled to 100's of nanometers, sometimes 10's of nanometers and sometimes several nanometers. This opens up an opportunity to consider a vertical transistor structure, where the current carriers traverse vertically between layers, rather than laterally.

It would be advantageous to leverage the ability to control the layer thickness to enable a vertical transistor structure and to enable the use of a vertically arranged gate electrode structure. Such a structure would advantageously provide transistor operations with low switching times and high drain current.

The apparatus and methods of the present invention provide the foregoing and other advantages.

SUMMARY OF THE INVENTION

The present invention relates to a vertical-structure type thin film transistor (TFT) having a gate electrode structure adapted to allow the flow of electrons therethrough, which provides a high drain current and low operation voltage.

In one example embodiment of the present invention, a vertical dual gate TFT is provided. Such a dual gate VTFT may comprise two gates, a mid gate and a top gate, wherein at least the top gate is created using a via forming method. In such an example embodiment, a first layer of conductor forming the source electrode may be deposited on a substrate layer (e.g., glass). A layer of an insulator material (e.g., an oxide layer) may be deposited on top of the first conductor layer forming a mid gate. A second conductor layer forming the drain electrode may be deposited on the layer of insulator material. One or more via holes may be formed in the layer stack using a photoresist material and an etching process. The via holes may penetrate through the layer stack to the top of the substrate layer and be formed with inward sloping side walls. Once the via holes are formed, a semiconductor layer (e.g. IGZO), a gate insulator, and a gate electrode, respectively, may then be deposited. This results in the formation of a top gate with a semiconductor channel between the source, mid gate (e.g., oxide layer), and drain.

Such an arrangement has the advantage of mitigating the short channel effect when the source and drain electrodes are closer to one another. This is accomplished by charging the mid gate layer, e.g., to form an electret that holds a permanent charge. The short channel effect can be mitigated by two ways, an active mid gate (insulator/conductor/insulator tri-layer) or a passive mid gate (insulator only) that is charged (electret). In the case of an N-type semiconductor such as an IGZO, a negatively charged mid gate will turn the semiconductor channel off. With a sufficient amount of charge on the mid gate, the TFT will not turn on even when the drain to source voltage is high, hence the short channel effect is avoided. Applying a sufficient voltage to the top gate would turn the TFT on.

In an example embodiment in accordance with the present invention, a dual gate vertical TFT is provided, comprising a substrate layer, a first layer stack and a second layer stack. The first layer stack may comprise a first conductor layer deposited on the substrate layer forming a source electrode, a first insulator layer deposited on the first conductor layer forming a mid-gate, and a second conductor layer deposited on the first insulator layer forming a drain electrode. The layers of the first layer stack may be patterned to expose at least portions of the first conductor layer, the first insulator layer, and the second conductor layer. The second layer stack may comprise a semiconductor layer making electrical contact with the source electrode and the drain electrode, forming a substantially vertical channel between the source electrode and the drain electrode across the mid-gate, as well as a second insulator layer forming a top-gate insulator, and a third conductor layer forming a top-gate electrode. The layers of the second layer stack may be patterned to form a top-gate.

The substantially vertical channel may be shorter than a minimum size pattern that can be formed laterally by lithography.

The mid-gate may comprise an insulator material electrically charged to form a passive mid-gate.

In one example embodiment, the mid-gate may comprise an active gate and the top gate may comprise an active gate. In a further example embodiment, the mid-gate may comprise an active gate and the top gate may comprise a passive gate. Alternatively, the mid-gate may comprise a passive gate and the top gate may comprise an active gate.

In embodiments where the mid-gate comprises an active gate, the active mid-gate may comprise a conductor layer enclosed by an insulating material. In embodiments having a passive gate, the passive gate may comprise a multi-stack gate having multiple layers of insulators, one or more of the layers of insulators being electrically charged.

The first layer stack may be patterned to form a via hole in the first layer stack. In such an embodiment, the substantially vertical channel is formed inside the via hole. The via hole may be formed with inward sloping side walls. The via hole may penetrate the first layer stack at least partially into the source electrode. In a further example embodiment, the via hole may penetrate through the first layer stack up to a top of the substrate layer.

In a further example embodiment in accordance with the present invention, at least one additional via hole may be provided in the first layer stack exposing the first conductor layer, the first insulator layer, and the second conductor layer. For example, two or more via holes may be provided. Further, the via hole or via holes may take any shape or form, for example an irregular shape, a geometric shape, a rectangular shape, a square shape, a triangular shape, a circular shape, or an oval shape.

A patterning of the via hole may only partially overlap with the patterning of the first layer stack. This results in a vertical sidewall where there is no overlap and inward sloping sidewalls in the areas of overlap.

In a further example embodiment, the patterning of the first layer stack may result in sloped side walls on an outside of at least the first insulator layer and the second conductor layer. Alternatively, the patterning of the first layer stack may result in sloped side walls on an outside of the first conductor layer, the first insulator layer and the second conductor layer. In such embodiments, the substantially vertical channel is formed on the outside of the first layer stack.

The present invention also includes methods of fabricating a dual gate vertical TFT. In accordance with one example embodiment of the present invention, such a method may comprise providing a substrate layer, forming a first layer stack, and forming a second layer stack. The first layer stack may be formed by depositing a first conductor layer on the substrate layer to form a source electrode, depositing a first insulator layer on the first conductor layer to form a mid-gate, and depositing a second conductor layer on the first insulator layer to form a drain electrode. The layers of the first layer stack may be patterned to expose at least portions of the first conductor layer, the first insulator layer, and the second conductor layer. The second layer stack may be formed by depositing a semiconductor layer making electrical contact with the source electrode and the drain electrode, forming a substantially vertical channel between the source electrode and the drain electrode across the mid-gate, depositing a second insulator layer forming a top-gate insulator on the semiconductor layer, and depositing a third conductor layer forming a top-gate electrode on the second insulator layer. The layers of the second layer stack may be patterned to form a top-gate.

The methods may also include additional features and functionality of the dual gate TFTs described above.

BRIEF DESCRIPTION OF THE DRAWINGS

The present invention will hereinafter be described in conjunction with the appended drawing figures, wherein like reference numerals denote like elements, and.

DETAILED DESCRIPTION

Figure 1A:
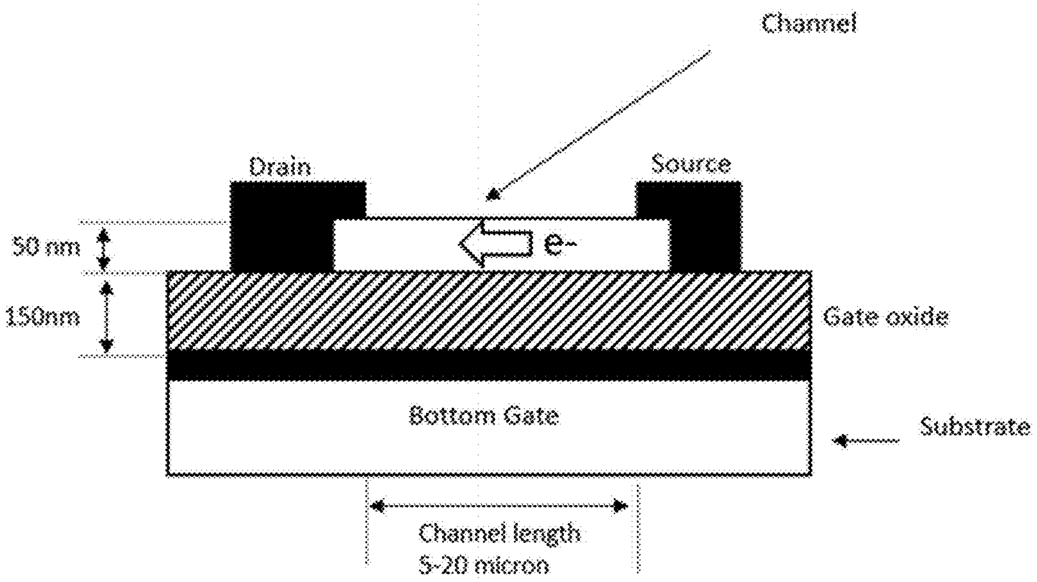
FIG. 1A (PRIOR ART)
FIG. 1A shows an example embodiment of a prior art oxide-TFT structure with a lateral active channel having a bottom gate structure.
Figure 1B:
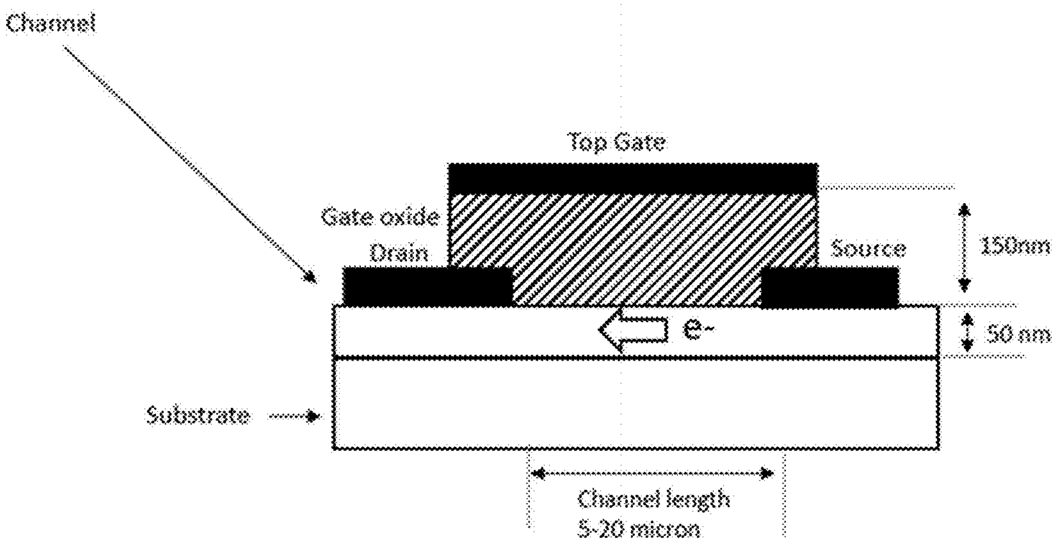
FIG. 1B (PRIOR ART)
FIG. 1B shows an example embodiment of a prior art oxide-TFT structure with a lateral active channel having a top-gate structure.

The ensuing detailed description provides exemplary embodiments only, and is not intended to limit the scope, applicability, or configuration of the invention. Rather, the ensuing detailed description of the exemplary embodiments will provide those skilled in the art with an enabling description for implementing an embodiment of the invention. It should be understood that various changes may be made in the function and arrangement of elements without departing from the spirit and scope of the invention as set forth in the appended claims.

The present invention relates to a vertical-type thin film transistor (TFT) having a gate electrode structure adapted to allow the flow of electrons therethrough, which provides a high current drain current ($I_{DS}$>0.1 A) and low operation voltage ($V_{th}$<1.5V). Corresponding methods of producing such a vertical-type thin film transistor are also provided. For example, one embodiment may comprise a vertical-structure type TFT using a wide band gap oxide semiconductor channel including amorphous/crystalline materials and a gate electrode structure adapted to allow the flow of electrons therethrough (such as a perforated or comb-like structure), which provides a high current drain current ($I_{DS}$>0.1 A) and low operation voltage ($V_{th}$<1.5V).

Although the present invention is described herein in relation to an enhancement mode type transistor, those skilled in the art will appreciate that the vertical structure disclosed herein may be used in a depletion mode type transistor by changing device parameters such as the turn on threshold voltage. Further, the vertical structure of the present invention may be used to implement different types of transistor structures, including non-TFT structures.

The present invention involves controlling the current carriers between the source and the drain that are arranged vertically one above the other. Basically, the current will flow between 2-D sheets of source and drain contacts, where the semiconducting material is sandwiched between the vertically arranged source and the drain contacts. This results in a 3-D volume of current carrying electrons (or holes) flowing from the source electrode to the drain electrode between the structure of the gate electrodes, thereby increasing the total current that can be switched. Since the current flow is vertical and over a shorter distance, high current is achieved. Also, the switching on-resistance decreases and the transistor switching time is reduced, resulting in a fast, high current handling transistor.

It should be appreciated that the term “electrons” is synonymous with the term “current carriers” as used herein, which is typical of N-type semiconductors. Those skilled in the art should appreciate that if a P-type semiconductor is involved, the current would be carried by holes. In a popular TFT design, the semiconductor material can be Silicon, such as amorphous Si and poly-Si or an oxide semiconductor material, such as IGZO (Indium Gallium Zinc Oxide), which typically form N-type channels. In an organic TFT, the semiconducting material is more often a P-type material. An intrinsic semiconductor, such as undoped Silicon, has an approximately equal number of electrons and holes present as current carriers. It should be understood that the present invention applies equally well to all semiconducting materials, even though the present disclosure primarily discusses using electrons as the current carrier.

It should also be understood that the vertical transistor structure disclosed herein equally applies to other transistor designs that are not constructed using the TFT process, such as CMOS processes that start with bulk substrates.

Figure 2A:
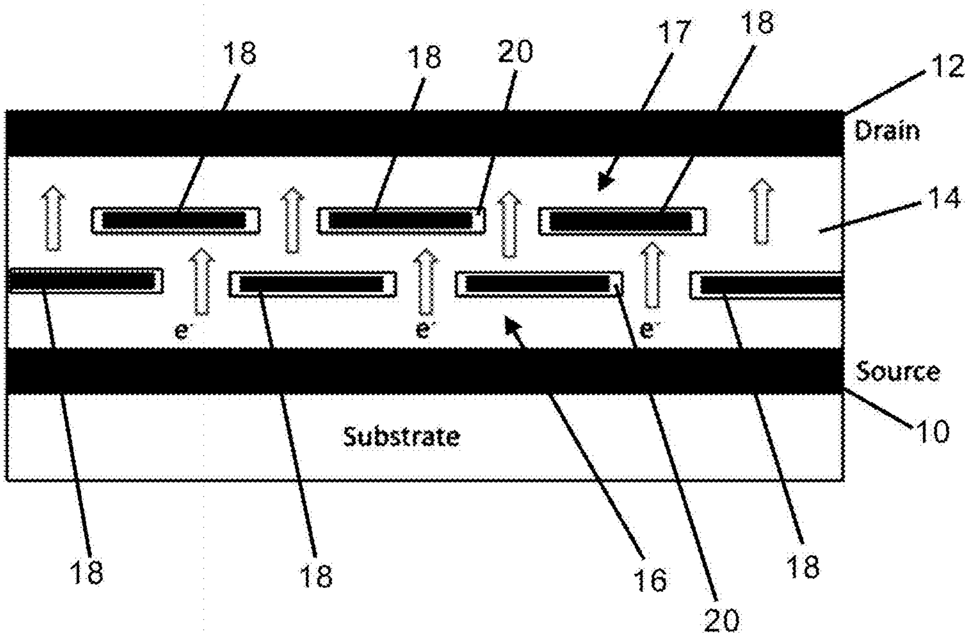
FIGS. 2A and 2B show an example embodiment of a vertical TFT structure in accordance with the present invention.
Figure 2B:
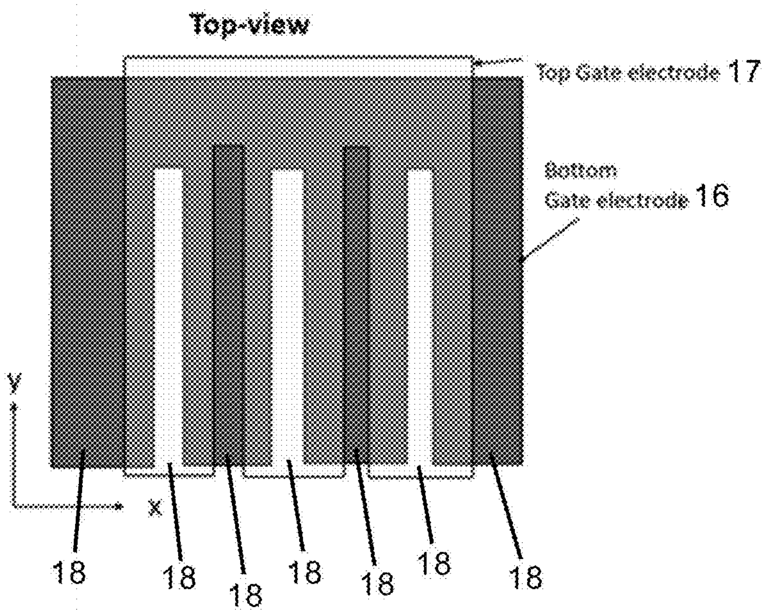

One aspect of the present invention is the use of embedded gate electrodes within the semiconductor material. An example embodiment of a vertical TFT structure in accordance with the present invention is shown in FIGS. 2A and 2B. A source electrode 10 and a drain electrode 12 extend parallel to one another, with the source electrode 10 below the drain electrode 12. A semiconductor layer 14 is arranged between the source electrode 10 and the drain electrode 12. Two or more layers of gate electrodes (e.g., first gate electrode 16 (also referred to herein as the bottom gate electrode) and second gate electrode 17 (also referred to herein as the top gate electrode)) are embedded in the semiconductor layer 14 between and parallel to the source electrode 10 and the drain electrode 12. Each of the two or more gate electrodes 16, 17 comprise a structure adapted to allow the flow of electrons therethrough.

Each gate electrode 16, 17 may be perforated, or have a mesh, gate, lattice, or comb-like structure to let electrons flow between the elements of the structure itself. The present invention encompasses any gate electrode structure that allows the flow of electrons between and/or around the elements of the structure. Accordingly, although various embodiments of the present invention are discussed below as employing a comb-like gate electrode structure (also referred to herein as "comb-gate electrodes"), the present invention encompasses any type of gate electrode structure that allows the flow of electrons through the structure itself, such as a mesh structure, a perforated structure, a lattice structure, an offset structure, or any similar structure that permits the flow of electrons therethrough, as will be described in more detail below.

Figure 3A:
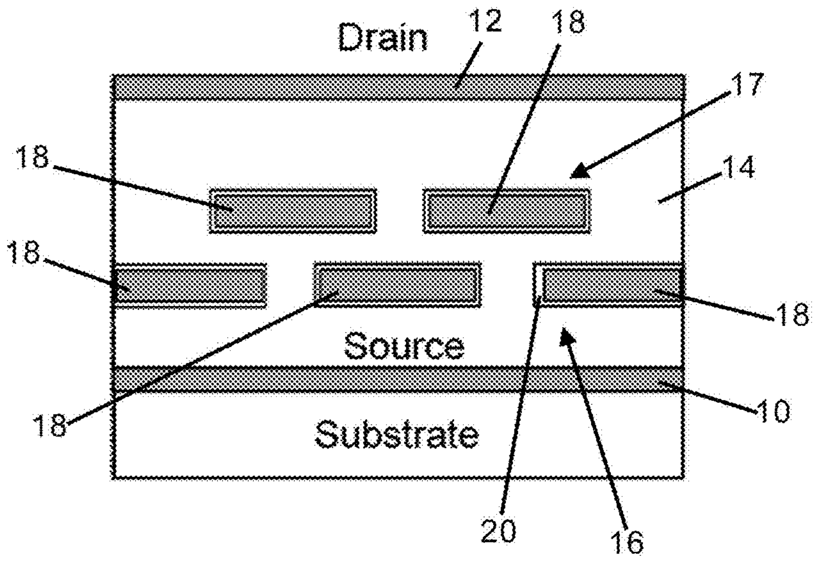
FIGS. 3A, 3B, and 3C show a further example embodiment of a vertical TFT structure in accordance with the present invention.
Figure 3B:
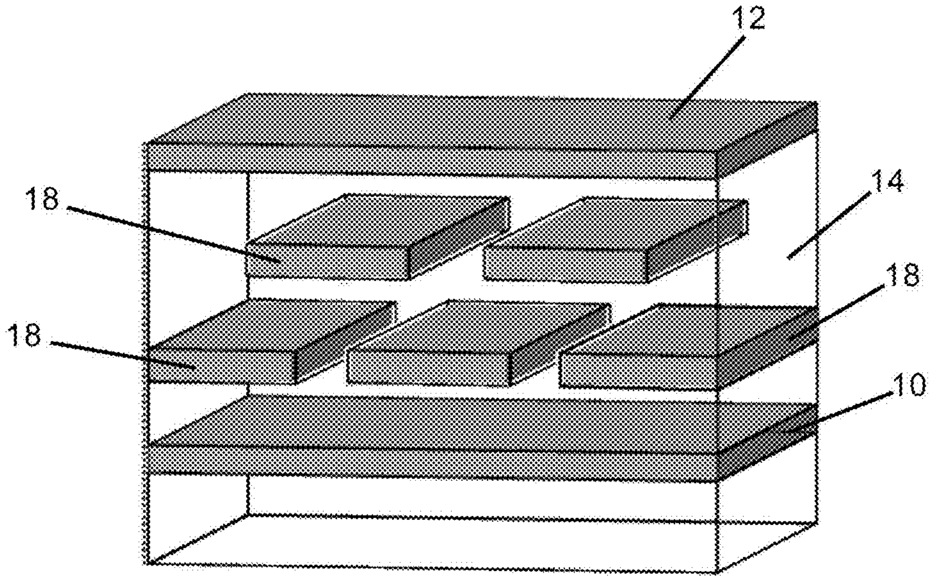
Figure 3C:
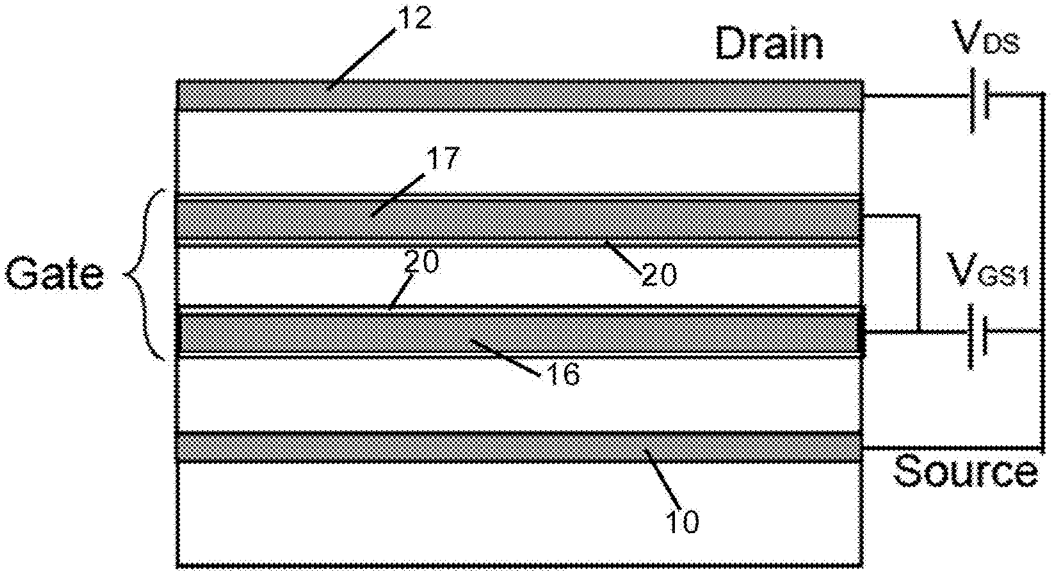

In an embodiment comprising a comb-like gate electrode structure as shown in FIGS. 2A and 2B, the combs 18 of adjacent gate electrodes 16, 17 are offset from one another such that, for example, the combs 18 of the one gate electrode are aligned with the spaces between the combs of an adjacent gate electrode and vice versa, as shown in FIG. 2B. This arrangement blocks a direct electric field between the source electrode 10 and the drain electrode 12 by preventing a direct path from the source to the drain for the electrons. This prevents the device from turning on inadvertently. When the gate voltage Vgs1 between the source electrode 10 and the first gate electrode 16 is below Vth, the turn on voltage, the transistor stays turned off regardless of the drain voltage. When the gate voltage Vgs1 exceeds the turn on voltage Vth, the carrier electrons are generated within the semiconductor layer 14 and the electrons flow between the combs 18, past the second gate electrode 17, and flow to the drain electrode 12, thereby turning on the transistor. The gate voltage Vgs2 of the second gate electrode 17 can be tied to the first gate electrode 16 for this purpose, applying the same voltage to each gate electrode 16, 17. FIGS. 3A-3C show a further example of a comb gate electrode configuration in a vertical TFT structure in accordance with the present invention where the same voltage is applied to both gate electrodes 16, 17.

Figure 4A:
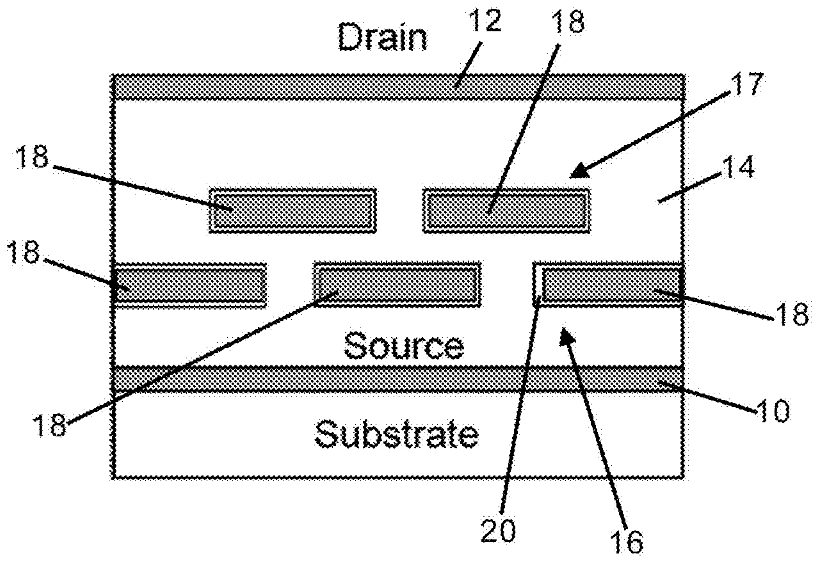
FIGS. 4A, 4B, and 4C show a further example embodiment of a vertical TFT structure in accordance with the present invention.
Figure 4B:
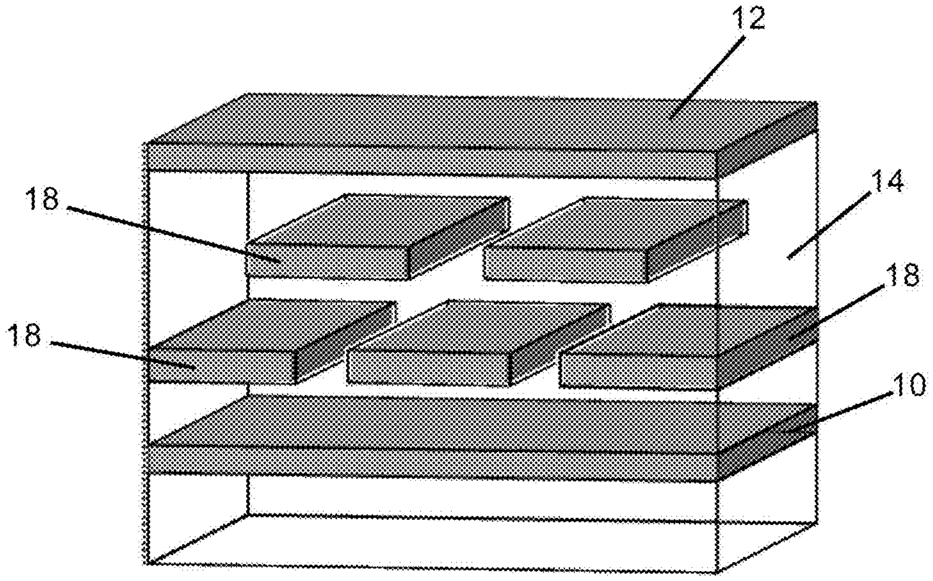
Figure 4C:
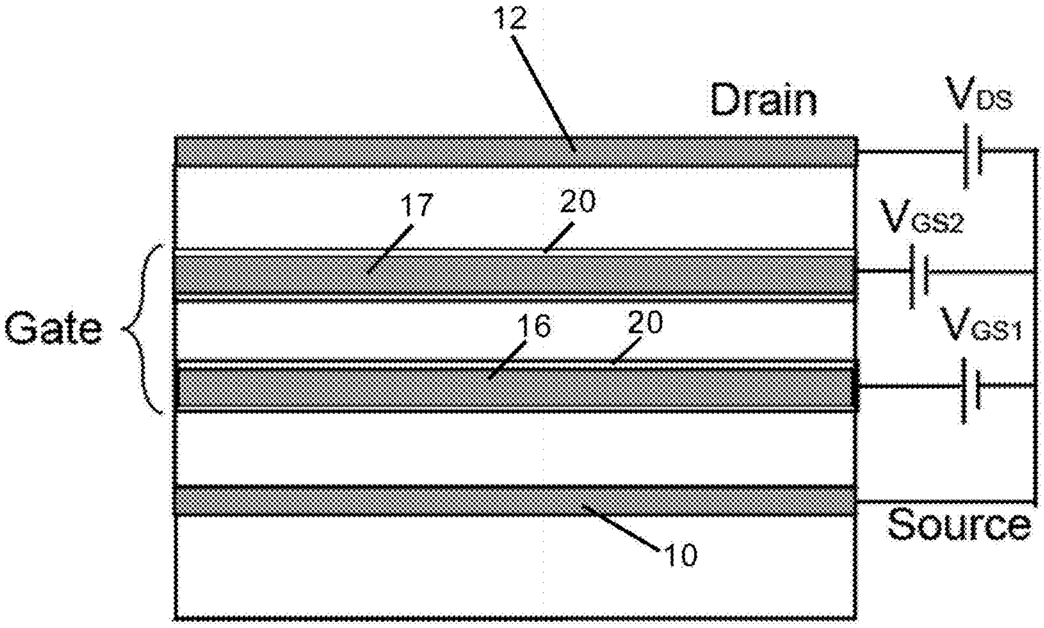

However, an independent control of the Vgs1 and Vgs2 may lead to other modes of operation for the same transistor device. For example, when an intrinsic semiconductor is used as the channel, a sufficient voltage difference between Vgs1 and Vgs2 would generate carrier electrons and holes in the semiconductor layer 14 around the two gate electrodes 16, 17, which would turn the transistor on. FIGS. 4A-4C shows an example of a comb gate electrode configuration in a vertical TFT structure in accordance with the present invention having a dual gate electrode structure where Vgs1 and Vgs2 are controlled independently. As shown in FIGS. 3C and 4C, the comb gate electrodes 16, 17 may be connected at the outside of semiconductor channel 14.

A gap between a first gate electrode 16 of the two or more gate electrodes and the source electrode 10 may be of a different dimension than a gap between a second gate electrode 17 of the two or more gate electrodes and the drain electrode 12. For example, it should be noted that the placement of the first gate electrode 16 closer to the source electrode can sometimes be preferable, in order to reduce the turn on voltage Vth. The gap between the second gate electrode 17 and the drain electrode 12 can be increased to handle high drain voltage without breakdown. The combined effect would produce a high voltage handling transistor without having to increase the turn on voltage. Of course, the size or area of the source and the drain electrodes would increase the total current that can be switched. Therefore, various choices of the dimensions of this TFT would lead to different optimizations for various applications.

It should also be noted that both the first gate electrode 16 and the second gate electrode 17 (or more if present) should be sufficiently insulated from the semiconductor material by an insulator 20 so that no current flows in and out of the gate. The thickness of this insulator 20, which may be an oxide or a nitride, need not be very thick. For example, the thermal oxide that naturally forms around an aluminum gate electrode may be sufficient to insulate the gate electrode 16, 17 from the semiconductor material.

One example embodiment may employ a metal-oxide-semiconductor (MOS) structure. A wide bandgap metal oxide semiconductor channel may include crystal, polycrystal, micro-crystal, Nano-crystal, polymorphous, or amorphous forms. The semiconductor channel may also include a monoxide (such as ZnO, SnO, In2O3, Ga2O3, etc.) and multicomponent forms including binary systems (In—Zn—O (IZO), Sn—Zn—O (TZO), Ga—Zn—O (GZO), etc.), ternary systems (In—Ga—Zn—O (IGZO), In—Al—Zn—O (IAZO), Sn—Ga—Zn—O (TGZO) and more (In—Sn—Ga—ZnO (ITGZO) and In—Sn—Al—ZnO (ITAZO), etc.). Additionally, several combinations of Gate/gate oxides can be used such as $Si/SiO_2$, $Al/Al_2O_3$, $Ti/TiO_x$, Mo/MoOx and the like.

In accordance with such an example embodiment, the MOS structure may be provided with vertically stacked built-in gate electrodes. To achieve a high drain current, a short vertical channel (typically 10-200 nm) is preferable. Such a TFT operates with a gate bias of less than 3V and controls a high drain current in the order of amps, many orders of magnitude higher than a lateral transistor of a comparable size. However, the present invention may be implemented with a vertical active channel of the semiconductor layer having a length between 10 nm-5 um and a channel width of between 1 um-10 mm.

The comb gate/gate oxide configuration built into the active layer enables the control of current flow effectively and can achieve a low off current (<pA) and a large on/off current ratio.

The example embodiment of a vertical TFT shown in FIGS. 2A and 2B comprises two built-in gate electrodes 16, 17 in a comb gate/gate oxide configuration, one comb gate electrode being arranged above the other comb gate electrode. In such a configuration, electrons move from the bottom (source electrode 10) to the top (drain electrode 12). The active channel is vertical with a length of about 100-200 nm. The gate electrodes 16, 17 are arranged inside of the active channel region. The lateral dimension (i.e. channel width) depends on the number of comb gate electrode configurations, which is not limited. The range of a typical lateral dimension may be about 10-20 um.

However, the present invention may be implemented using only one layer of comb gate electrode, two comb gate electrodes as shown in FIGS. 2A-4C, or more layers of comb gate electrodes. Further, the present invention may be implemented with an offset gate structure, where one solid gate electrode is offset from an adjacent solid gate electrode, blocking a direct path for current flow from the source to the drain.

In a further example embodiment, a vertical channel TFT with a-In—Ga—Zn—O (a-IGZO) channels and Al/AlOx gate structure may be provided. The TFT structure can be fabricated on various materials including glass, plastics, ceramics, and the like. An amorphous In—Ga—Zn—O (a-IGZO) channel may be prepared by a physical vapor deposition (PVD) process such as sputtering or a solution process such as inkjet or a sol-gel process. Also, the aluminum gate electrode(s) may be prepared by a PVD method or a solution process. The aluminum oxide gate insulator may be formed by post-thermal annealing. The typical annealing temperature may be about 150-250° C. and the annealing time may be about 0.5-1 hr. The typical gate oxide thickness may be about 5-10 nm. The channel length (i.e. the distance between the source and drain) and the channel width are approximately 200 nm and um, respectively. The device turns on at low voltage which is about at $V_{GS}$<1V. When the $V_{GS}$ is applied over 10V, the $I_{DS}$ reaches a very high current over 1 A. The On/Off ratio is estimated to be over 10 orders of magnitude.

Figure 5:
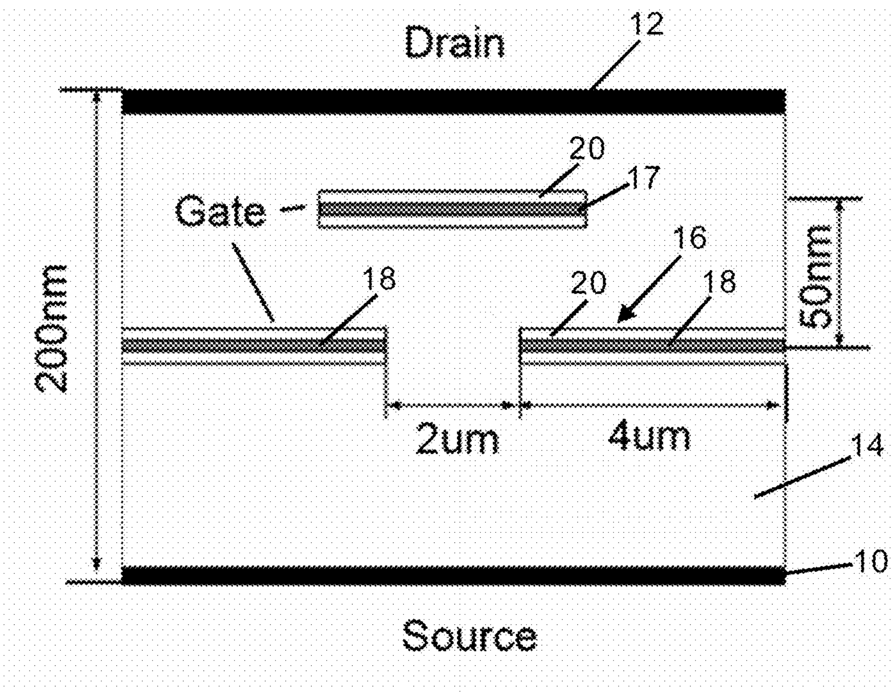
FIG. 5 shows a further example embodiment of a vertical TFT structure in accordance with the present invention.
Figure 6:
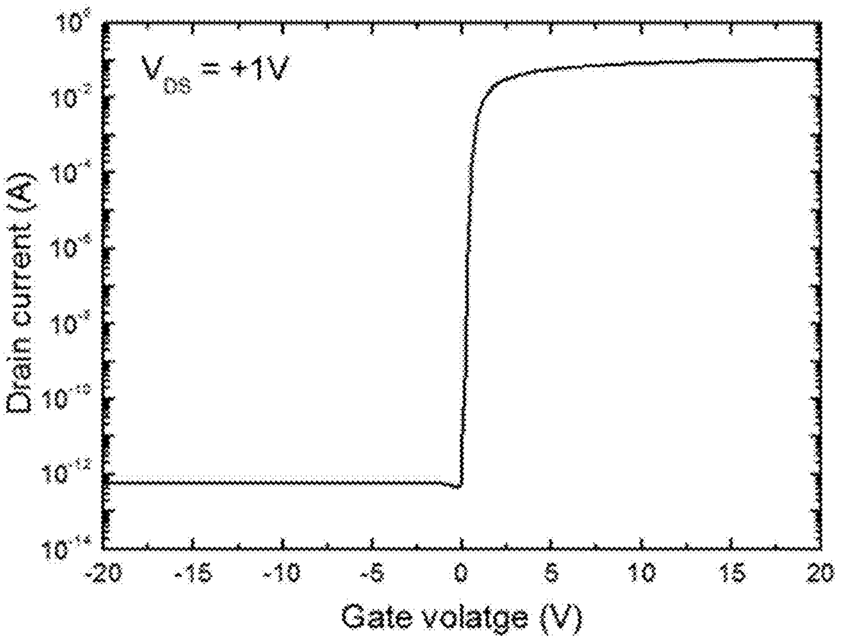
FIG. 6 shows a simulated Ids-Vgs curve at Vds=1V for the vertical TFT structure of FIG. 5.

FIG. 5 is a schematic illustration of a Vertical TFT structure model in accordance with an example embodiment of the present invention. The FIG. 5 TFT shows a dual gate electrode structure where only the bottom gate electrode 16 is a comb-gate electrode with combs 18. FIG. 6 shows a simulated Ids-Vgs curve at Vds=1V for the Vertical TFT structure of FIG. 5, with a-In—Ga—Zn—O (a-IGZO) channels Similar results can be achieved where both the first and second gate electrodes 16, 17 are comb-gate electrodes, or where there are more than two gate electrodes.

Figure 7A:
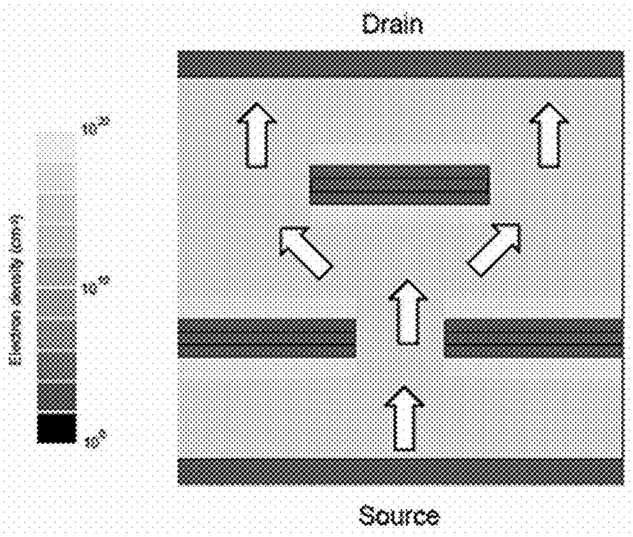
FIG. 7A shows a contour map of electron density and electron flow at a gate voltage in the ON state for the vertical TFT structure of FIG. 5.
Figure 7B:
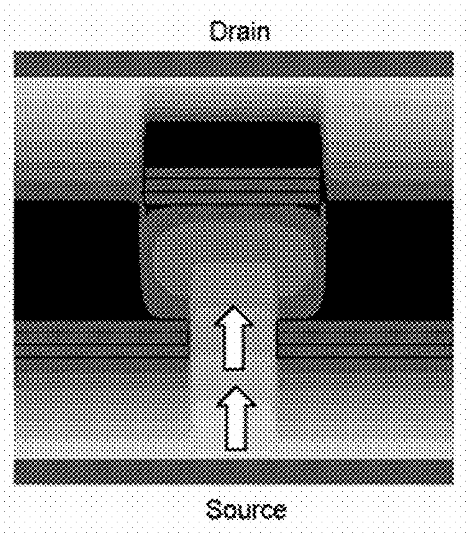
FIG. 7B shows a contour map of electron density and electron flow that is blocked in the OFF state for the vertical TFT structure of FIG. 5.

FIG. 7A shows a contour map of electron density ($10$-$10^{20}$ $cm^{-3}$) and electron flow at a gate voltage in the ON state (+20V) and FIG. 7B shows a contour map of electron density and electron flow that is blocked in the OFF State (−20V) for a Vertical TFT with a-In—Ga—Zn—O (a-IGZO) channels in accordance with the present invention. A high carrier accumulation region with $10^{19}$ $cm^{-3}$ is generated in these comb gate electrodes by a positive gate bias with 20V. In this case, high current flow from drain to source electrode is achieved. In contrast, the depletion region with a carrier density of about $\leq 10^{10}$ $cm^{-3}$ is formed when the gate voltage is −20V. Therefore, current flow is well suppressed at the gap in a comb-gate electrode and is very low level (<fA).

Figure 8A:
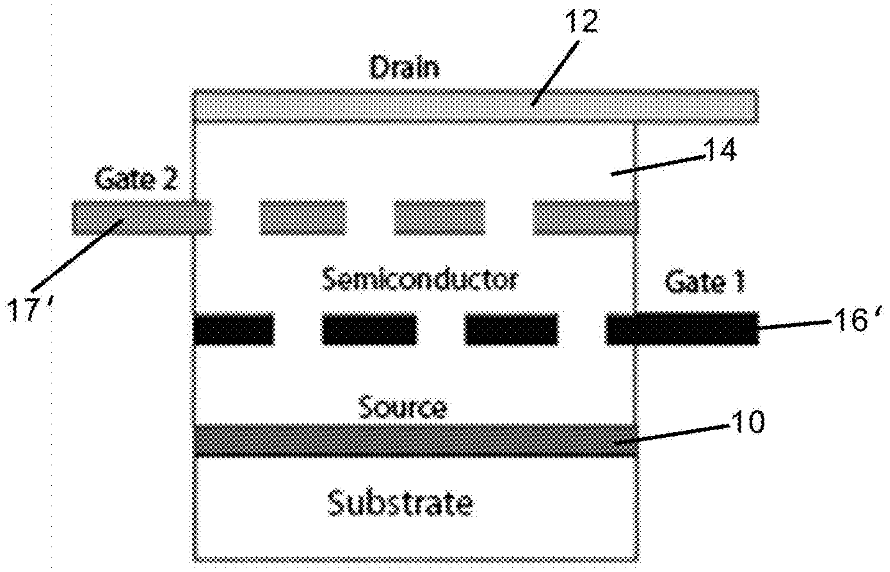
FIGS. 8A and 8B show a further example embodiment of a vertical TFT structure in accordance with the present invention.
Figure 8B:
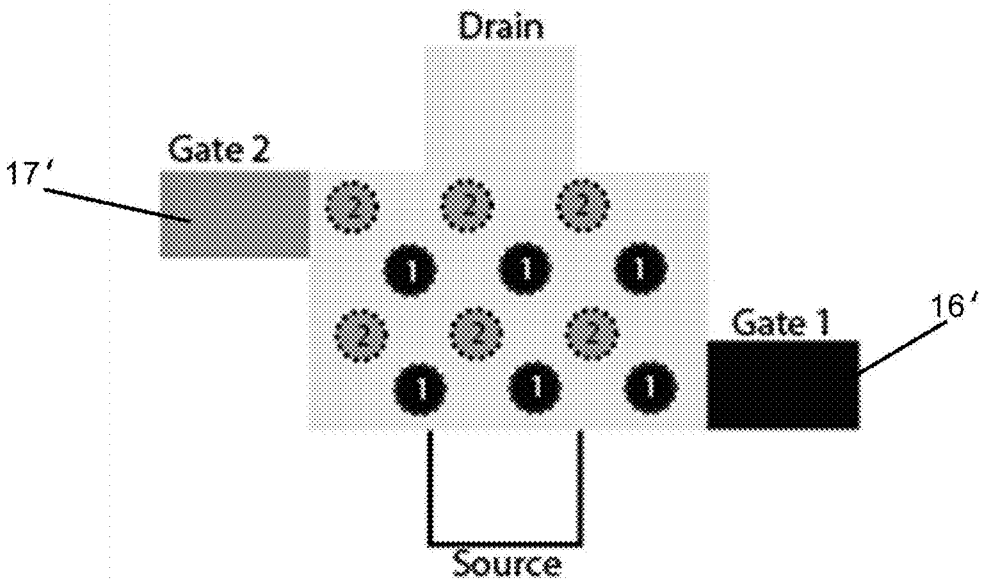

FIGS. 8A and 8B show a further example embodiment of a vertical TFT structure where, instead of the gate electrodes having a comb-like structure, the gate electrodes 16' and 17' have a perforated structure. Such a perforated structure may comprise round holes as shown in FIG. 8B in each gate electrode 16', 17'. Alternatively, similar results may be achieved using square holes or a lattice type structure. Regardless of the configuration of the perforations, the perforations of one gate electrode will be offset from the perforations of the adjacent gate electrode. FIGS. 8A and 8B show the holes 1 of the first gate electrode 16' offset from the holes 2 of the second gate electrode 17'. This arrangement blocks a direct flow of electrons from the source to the drain. The holes may be on the order of 1 um.

Figure 9:
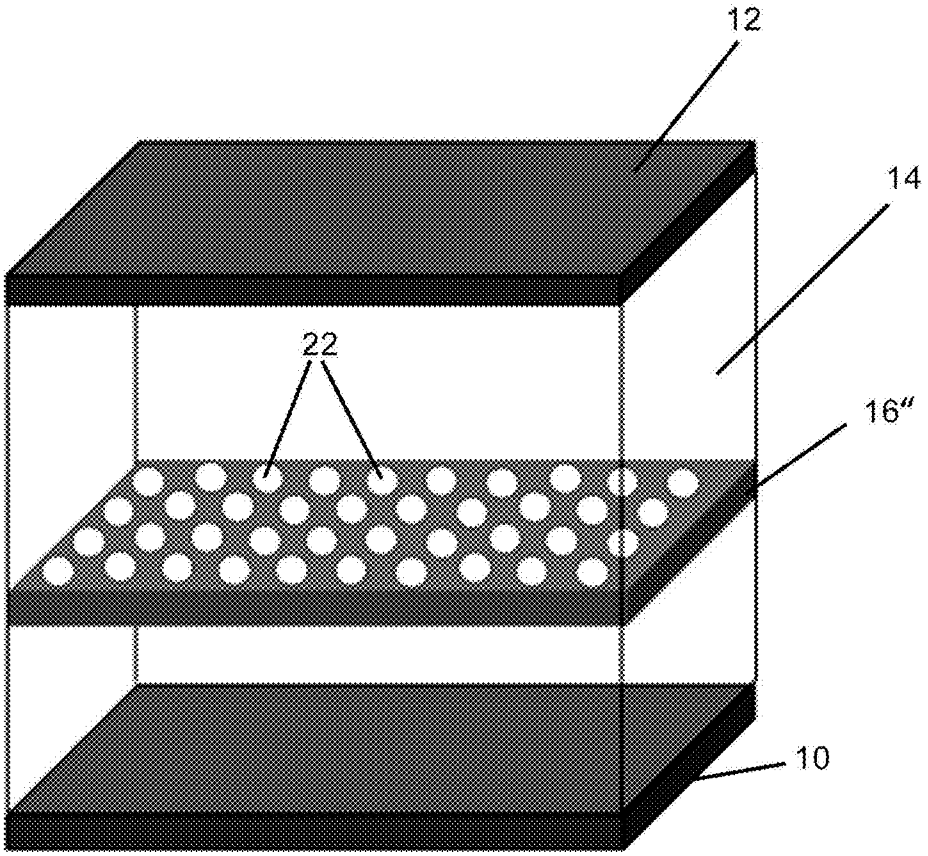
FIG. 9 shows an example embodiment of a vertical TFT with a single gate structure in accordance with the present invention.

FIG. 9 shows a further example embodiment of a vertical TFT in accordance with the present invention having only one gate electrode 16" embedded in the semiconductor layer 14 and arranged between the source electrode 10 and the drain electrode 12. The single gate electrode may comprise micro-perforations 22 configured to control the flow of electrons therethrough in dependence on a predetermined voltage difference between the source electrode and the single gate electrode.

The gate electrode 16" may be formed using one of a CMOS fabrication method, e-beam lithography, and laser lithography. The micro-perforations 22 may be formed due to one of a property of a material of the gate electrode, a property of a material mixed with the material of the gate electrode, a deposition method, a curing method, or an annealing method. For example, a material that is easily oxidized can be mixed with the gate material, such that during the fabrication process the material is removed leaving the holes. Other possibilities for forming such a gate material with perforations exist, such as using a semiconductor material such as silicon or other suitable semiconductor material mixed in with a polymer that is removed in the fabrication process, leaving behind the perforations.

The micro-perforations 22 may have a diameter or width of approximately 1 nm-1 um and a thickness of approximately 10 nm-1 um. In such a gate electrode, the holes may be so small that the electric field between the source and the drain is masked by the single gate electrode. At a predetermined voltage difference between the gate electrode and the source voltage, the masking effect is reduced and the electrons are permitted to pass through the holes. If the gate to source voltage rises further, the rate at which the electrons pass through the perforations may increase. The predetermined voltage may be approximately negative 0.3-10 v in order to terminate electron flow in a depletion-type TFT and approximately positive 0.3-10 v in order to permit electron flow in an accumulation-type TFT.

It should now be appreciated that the present invention provides an advantageous TFT structure employing a gate structure which provides a high drain current with fast switching capabilities.

It should also be noted that the present invention makes it practical to use commonly available fabrication methods in TFT technology that have limited patterning feature size, typically in micrometers. Other fabrication techniques that afford finer feature sizes down to nanometers, or other material innovations for generating perforated gate material may lead to a possibility of reducing the number of gate electrodes to one. The small passageways the electrons have to pass through would control the current flow sufficiently to gain a reasonably good switching behavior with just one layer of gate electrode.

In one example embodiment for fabrication of a Vertical TFT with comb-gate electrodes in accordance with the present invention, one goal is to ensure that the gate electrode(s) are completely insulated (electrically) with an insulator, preferably an oxide or nitride, from the surrounding semiconductor in order for the device to function as a transistor. In such a fabrication method, it is assumed that the semiconductor layer is based on one of silicon or a silicon-based material, a III-V semiconductor material, an organic semiconductor material, a metal oxide type semiconductor material, e.g. IGZO (Indium, Gallium, Zinc, Oxide), that contains oxygen, a metal nitride semiconductor material, e.g. GaN that contains nitrogen, an oxide-based semiconductor material, or a metal oxynitride semiconductor material, e.g. ZnON that contains oxygen and nitrogen. It is also assumed the gate electrode material is a metal, e.g. Aluminum, Silicon, Titanium, or the like. The source and drain electrode material can also be metal, but may or may not be the same metal as the gate electrode, e.g. Molybdenum, Aluminum, or the like. Conductive oxides, e.g. ITO and IZO may also be used for the source/drain electrodes.

In forming the vertical TFT, the deposition order may be (in a vertical stack from bottom to top):

Substrate (insulator)
Source electrode (metal 1)
Semiconducting layer (e.g. IGZO)
Comb Gate electrode 1 (metal 2), patterned (perforated or comb structure)
Semiconducting layer (e.g. IGZO)
Comb Gate electrode 2 (metal 3), patterned (perforated or comb structure)
Semiconducting layer (e.g. IGZO)
Drain electrode (metal 4)

The three different depositions of the same semiconducting material produces one connected semiconducting layer, as the layer boundaries disappear (other than the gate electrodes). Gate electrodes 1 and 2 are initially preferably in Ohmic contact with the semiconducting layer since they are completely encased by the semiconducting layer. The source and drain electrodes are also in ohmic contact with the semiconducting layer and this ohmic contact is to be maintained.

It should be appreciated that, since the semiconducting layers are applied in three stages, different semiconducting materials (or different application techniques) can be used to form each semiconducting layer.

The critical task in the process is to form the insulating layer around the gate electrodes for the device to function, making a Metal (gate)-oxide-semiconductor (MOS) structure.

In the formation of the insulating oxide around the gate electrode structures, the aim is to maintain the ohmic contact of the source and drain electrodes. Using Molybdenum as the source and drain electrode material is preferable, while ITO and IZO can also be used, as these materials also survive with ohmic contact.

A high temperature thermal annealing will produce oxides around the gate electrode metal by drawing oxygen from the semiconducting material that already contains oxygen. However, the aim is to form the insulating oxide around the gate electrodes, but not at the source and drain electrodes.

A first solution is to deposit a different metal for the source and drain contacts (metal 1 and metal 4) that oxidizes at a higher temperature than the gate electrode metal (metal 2 and metal 3). In such an embodiment, the device can be subject to an annealing process at a temperature and duration that forms oxides around the gate electrodes, but not around the source and drain electrodes. For example, aluminum may be used for the gate electrodes and molybdenum may be used for the source and drain electrodes. In general, Aluminum oxidizes at a lower temperature than Molybdenum. Al2O3 (alumina) forms around bare aluminum even at room temperature when exposed to air. At certain annealing temperatures, Aluminum will draw oxygen from the IGZO semiconducting layer to form an Al2O3 insulator, while Molybdenum will stay un-oxidized and maintain the ohmic contact with IGZO.

Even if Molybdenum source or drain electrodes is partially oxidized, the non-stochiometric MoOx that forms is still highly conductive and does not impair device operations. The temperature, the duration of annealing and annealing atmosphere will affect the thickness of the oxide around the gate electrodes.

A second solution is to use local Joules heating. In such an embodiment, the same or different metal may be deposited for the source and drain electrode material (metal 1 and metal 4) and for the gate electrode material (metal 2 and metal 3). The device may be subject to an annealing process at a temperature just below the temperature at which the source and drain electrodes oxidize. Current is then applied between the two gate electrodes to produce Joules heating on the surface of the gate electrodes. The current can be AC or DC, or a combination (e.g. AC with a DC offset). The gate electrodes will oxidize due to locally elevated temperatures. The current will be reduced or stop flowing once the oxidation is complete and gate electrodes are insulated.

The current can also be applied between the gate electrode(s) and either the source or drain electrodes, or both. The larger surface area on the source and drain electrodes would reduce Joules heating there. As a result, the gate electrode(s) heat up more than the source and drain electrodes, and thus will oxidize before the source and drain electrodes.

It might be advantageous if only one of the two gate electrodes is selected at a time for joules heating since the larger combined surface area of the source and the drain electrodes will reduces corresponding joules heating at the source and the drain electrodes, localizing heating to that one gate electrode so that it oxidizes before the source and drain electrodes.

The progress and completion of the oxide formation can be monitored by resistance or capacitance measurements, or by an amount of time measurement of the current flow.

A third solution is use voltage to assist in oxide formation in addition to the techniques of solution two above, in order to obtain a thicker oxidation layer around the gate electrodes. Like solution two above, the same or different metals may be used for the source and drain electrodes as well as for the gate electrodes. The device may be subject to an annealing process at a temperature just below the temperature at which the source and drain electrodes oxidize. Current is then applied between the two gate electrodes to produce Joules heating on the surface of the gate electrodes. When the current stops flowing, it indicates a formation of at least a thin layer of oxide around the gate electrodes. At this stage, a higher voltage may be applied to the gate electrodes. The resultant high electric field will promote more migration of the oxygen out of the metal oxide semiconductor (e.g. IGZO) and allow thicker formation of the oxide around the gate electrodes. The applied voltage can be AC or DC, or a combination (e.g. AC with a DC offset). The voltage may be increased as the oxide gets thicker, but below the breakdown voltage of the oxide already formed. A capacitance measurement will be an indication of the thickness of the oxide formed and can be used to stop the applied voltage and the annealing process. The optimum duration, the temperature profile over time, and the voltage profile over time can be determined experimentally. Certain parameters can be modified or modulated based on the on-going measurements, including the capacitance.

It should be appreciated that in the second and third solutions discussed above, the polarity of the DC current or voltage will impact the process. A positive voltage on the gate electrode will help attract the oxygen atoms (which are typically negatively charged) to the gate electrode to oxidize the gate electrode. Conversely a negative voltage on the source or drain electrode will prevent or slow down oxidation and therefore help maintain the ohmic contact of the source or drain electrode with the semiconductor layer.

The present invention also includes a dual gate VTFT constructed using a via forming technique. In general, in TFT manufacturing, via forming is a typical term for making electrical contact at various depths in layers of material. It involves drilling or etching through one or more layers down to a desired layer, typically a conductor. In the present invention, via forming is used to drill down to expose the drain/insulator/source layer sidewalls so that the exposed side walls can be coated with a semiconductor layer and to form the rest of the gate structure.

As shown in FIGS. 10*a*-10*e*, such a dual gate VTFT may comprise two gates, a mid gate and a top gate, wherein at least the top gate is created using a via forming method. As shown in FIGS. 10*a*-10*e*, the via forming method results in sloped side walls where a vertical channel between the source and drain is formed. The resultant structure forms the desired vertical channel with a short distance between the source and the drain electrode, separated by a mid gate.

Figure 11A:
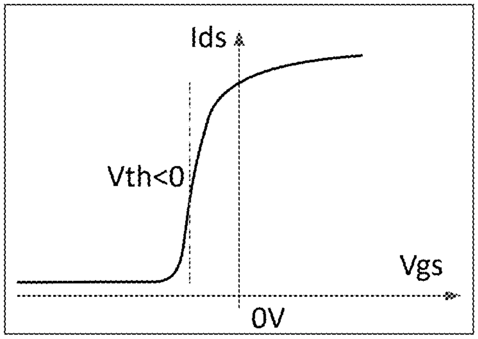
FIG. 11 (consisting of FIGS. 11*a*-11*d*) shows graphical representations of turn on voltage (threshold voltage, or Vth) for various vertical TFTs illustrating the short channel effect and how it can be overcome using a dual gate configuration.

However, such a short channel is difficult to turn off especially when the drain voltage is high, which accumulates the carriers in the semiconductor channel and keeps it conductive (FIG. 11*a*). Therefore, one of the two gates can be biased to pinch off the channel, turning off the TFT even when the drain voltage is high.

FIGS. 10*a*-10*e* show various embodiments of a dual gate vertical TFT. Such a dual gate vertical TFT may comprise a substrate layer 25, a first layer stack 27 and a second layer stack 29. The first layer stack 27 may comprise a first conductor layer 30 deposited on the substrate layer 25 forming a source electrode, a first insulator layer 32 deposited on the first conductor layer forming a mid-gate, and a second conductor layer 34 deposited on the first insulator layer forming a drain electrode. The layers of the first layer stack 27 may be patterned to expose at least portions of the first conductor layer 30, the first insulator layer 32, and the second conductor layer 34. The second layer stack 29 may comprise a semiconductor layer 36 making electrical contact with the source electrode and the drain electrode, forming a substantially vertical channel 38 between the source electrode and the drain electrode across the mid-gate, as well as a second insulator layer 40 forming a top-gate insulator, and a third conductor layer 42 forming a top-gate electrode. The second layer stack 29 is patterned to form a top-gate 41.

It should be noted that the terms first conductor layer and source electrode are used interchangeably herein and denoted by reference numeral 30. The terms first insulator layer and mid-gate are used interchangeably and denoted by reference numeral 32. The terms second conductor layer and drain electrode are used interchangeably and denoted by reference numeral 34. The terms second insulator layer and top-gate insulator are used interchangeably and denoted by reference numeral 40. The terms third conductor layer and top-gate electrode are used interchangeably and denoted by reference numeral 42.

The substantially vertical channel 38 may be shorter than a minimum size pattern that can be formed laterally by lithography.

The first layer stack 27 may be patterned to form a via hole 35 in the first layer stack 27. In such an embodiment, the substantially vertical channel 38 is formed inside the via hole 35. The via hole 35 may be formed with inward sloping side walls as shown in FIGS. 10*a*-10*e*. However, it should be appreciated that the via hole 35 may be formed with vertical or near vertical side walls, as long as the semiconductor material is able to coat the side walls without breaking.

Figure 10A:
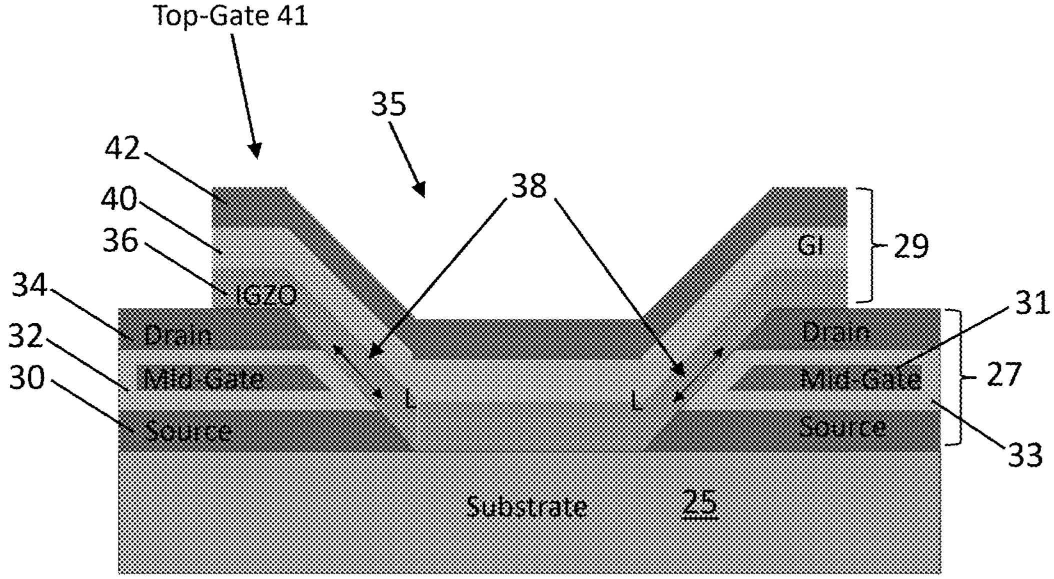
FIG. 10 (consisting of FIGS. 10*a*-10*e*) shows example embodiments of dual gate vertical TFT structures constructed using a via forming technique: dual active gates (FIG. 10*a*), passive top gate (FIG. 10*b*), passive mid gate (FIG. 10*c*), passive mid gate with partial source etching (FIG. 10*d*), and passive mid gate with multiple insulators for mid gate and top gate (FIG. 10*e*)
Figure 10B:
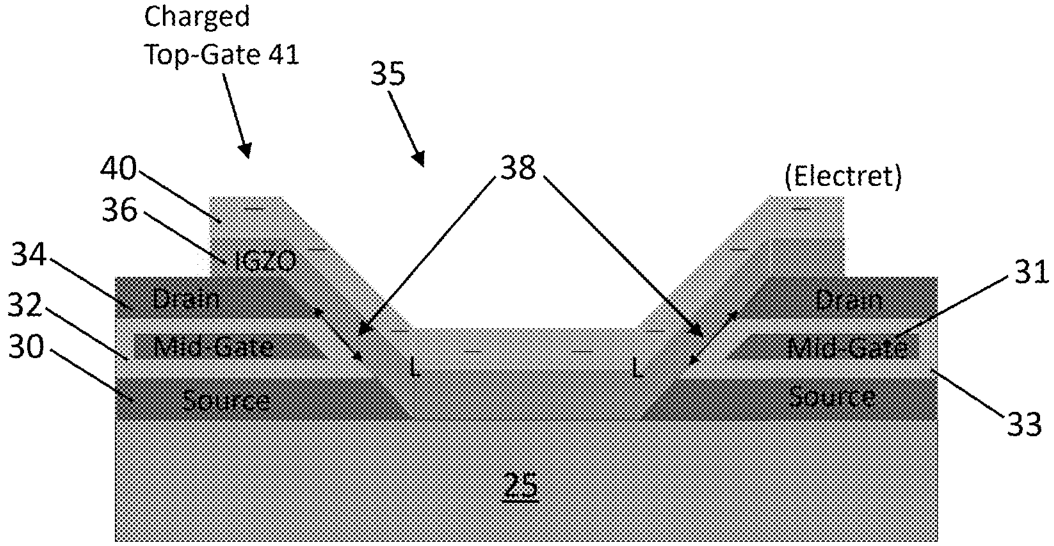
Figure 10C:
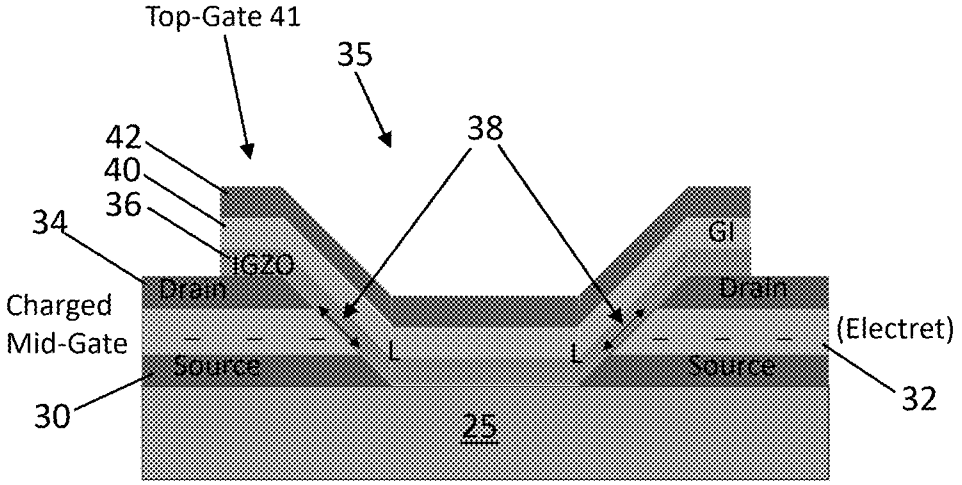
Figure 10D:
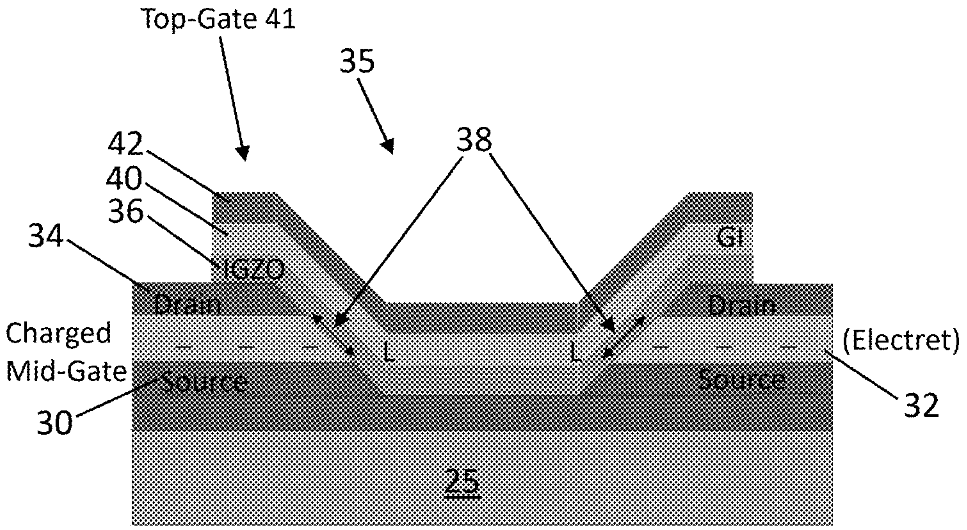
Figure 10E:
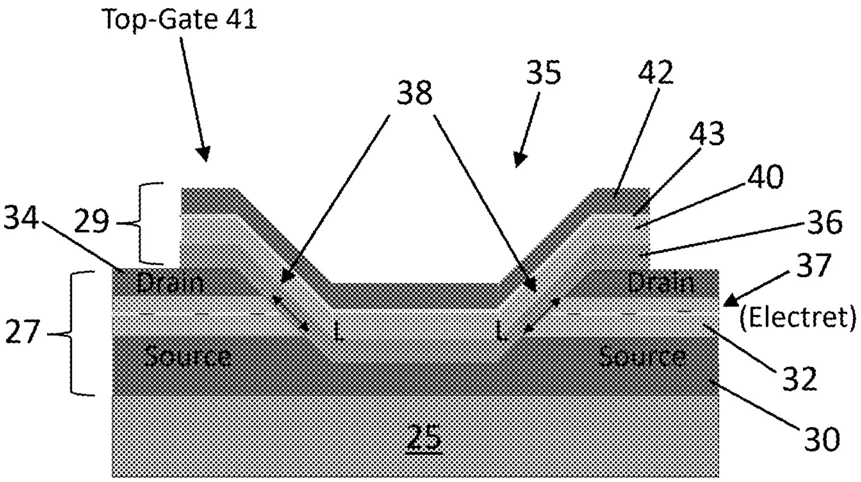

As shown in FIGS. 10*a*-10*c* the via hole 35 may penetrate through the first layer stack up to a top of the substrate layer. In a further example embodiment as shown in FIGS. 10*d* and 10*e*, the via hole 35 may penetrate the first layer stack 27 at least partially into the source electrode 30.

The source electrode 30 may comprise any conductor such as molybdenum, aluminum, and a conductive oxide such as ITO (Indium Tin Oxide). The mid-gate 32 may comprise one or more of any insulator such as silicon oxide, aluminum oxide, hafnium oxide, and silicon nitride. In a further example embodiment, the mid-gate 32 may comprise a charged layered structure comprising one or more layers of insulators. The drain electrode 34 may comprise any conductor such as molybdenum, aluminum, and a conductive oxide such as ITO. The semiconductor layer 36 may comprise any semiconductor such as amorphous silicon, LTPS (Low Temperature Poly Silicon), IGZO (Indium Gallium Zinc Oxide), carbon nanotubes, or organic semiconductors. The top-gate insulator 40 may comprise any insulator such as an aluminum oxide, a silicon nitride, a silicon oxide, and a hafnium oxide. The top-gate electrode 42 may comprise any conductor such as aluminum, aluminum alloy, molybdenum, and a conductive oxide such as ITO. In some example embodiments, a layer of ALD SiO2 or ALD Al2O3 may be deposited between the semiconductor layer and the top-gate insulator.

Figure 11B:
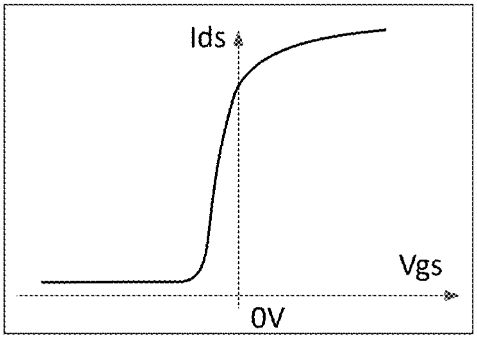
Figure 11C:
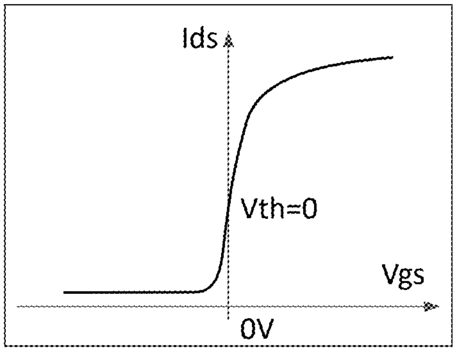
Figure 11D:
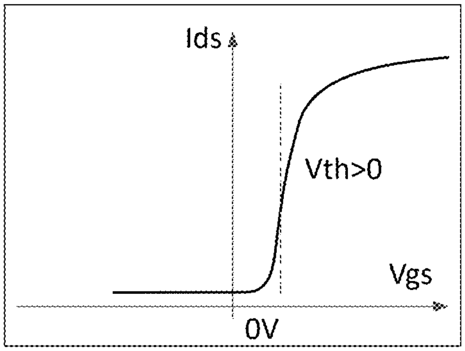

In one embodiment, one of the gates (active) may be used to turn on or off the transistor as in FIG. 11*c* and FIG. 11*d*. The other gate may be biased to a negative voltage, which shifts the turn on voltage (Vth) positive.

As shown in FIG. 10*a*, the mid-gate 32 may comprise an active gate and the top gate 41 may comprise an active gate. In such an embodiment, the mid-gate 32 may comprise an insulator stack comprising a conductor layer 31 enclosed by an insulating material or layer 33. In such an embodiment, the two active gates may have the same voltages (FIG. 10*a*). This results in a higher max current, but a short channel effect may exist when drain to source distance is small (FIG. 11*b*).

Typically, the top gate 41 comprises the second layer stack 29 consisting of the semiconductor layer 36, the second insulating layer 40 (top gate insulator), and the third conductor layer 42 (top-gate electrode) as shown in FIGS. 10*a*, 10*c*, 10*d*, and 10*e*. As shown in FIG. 10*b*, the mid-gate 32 may comprise an active gate (control) and a passive top gate 41. However, in an embodiment having a passive top gate as shown in FIG. 10*b*, the top gate electrode 42 is not needed. In such an embodiment, the top gate may comprise a semiconductor layer 36 and a second insulator layer 40 having an electret bias which functions as a passive top gate 41. In such an embodiment, the mid-gate 32 may comprise a conductor layer 31 enclosed by an insulating material 33.

As shown in FIG. 10*c*, the mid-gate 32 may comprise a passive gate (electret bias) and the top-gate 41 may comprise an active gate (control). An electret is a charge embedded in an insulator to form one of the gates (e.g., in either the top gate or the mid gate). Most TFT applications desire a Vth close to zero volt, corresponding to FIG. 11*c*, which can be achieved by adjusting the amount of charge on the mid gate, for example.

A preferred embodiment may comprise a passive mid gate (electret) electrically charged between the source and the drain electrodes, which is easier to fabricate. The charge can be positive or negative, depending on whether the semiconductor is a p-type or n-type, and the need for the control of the threshold voltage Vth.

In one example embodiment as shown in FIG. 10*e*, the mid-gate 32 may consist of multiple layers of insulators 37, made of different material (e.g., respective layers of SiO2, SiN, and SiO2). This provides better charge retention over time/temperature/humidity and a localized charge which pinches off a selected portion of the semiconductor (IGZO) channel. Such a charge is easier to overcome and turn back on by the active Gate when placed away from the high drain voltage. The top-gate insulator 40 may also consist of one or more layers of insulator material 43 (e.g., SiO2, SiN).

Figure 12:
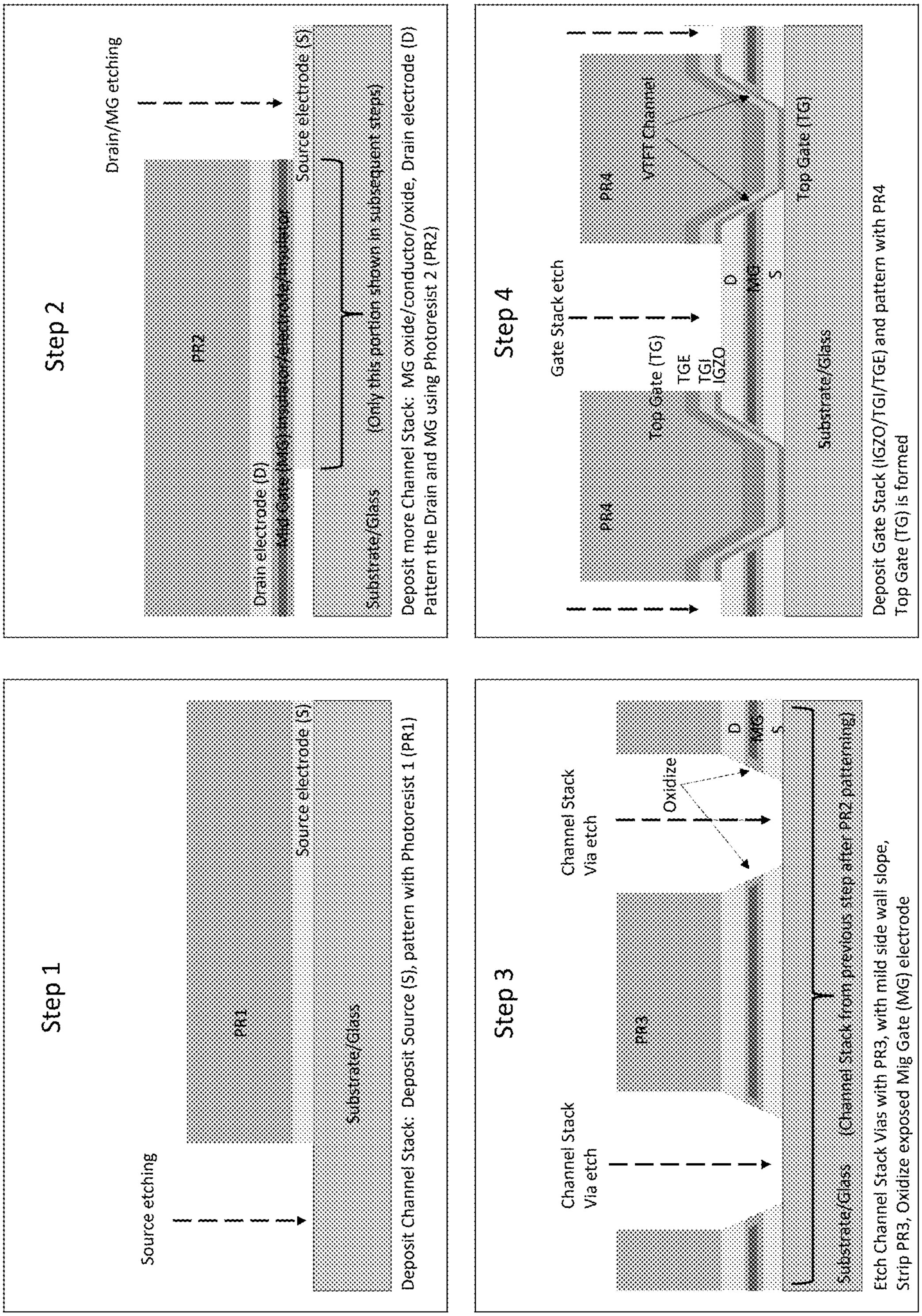
FIG. 12 shows an example embodiment of the via forming technique used to construct the vertical TFT of FIG. 10*a* or 10*b* (an active mid-gate with the mid-gate electrode insulated by an oxide, where the top gate is formed by etching without utilizing a lift-off process)
Figure 17A:
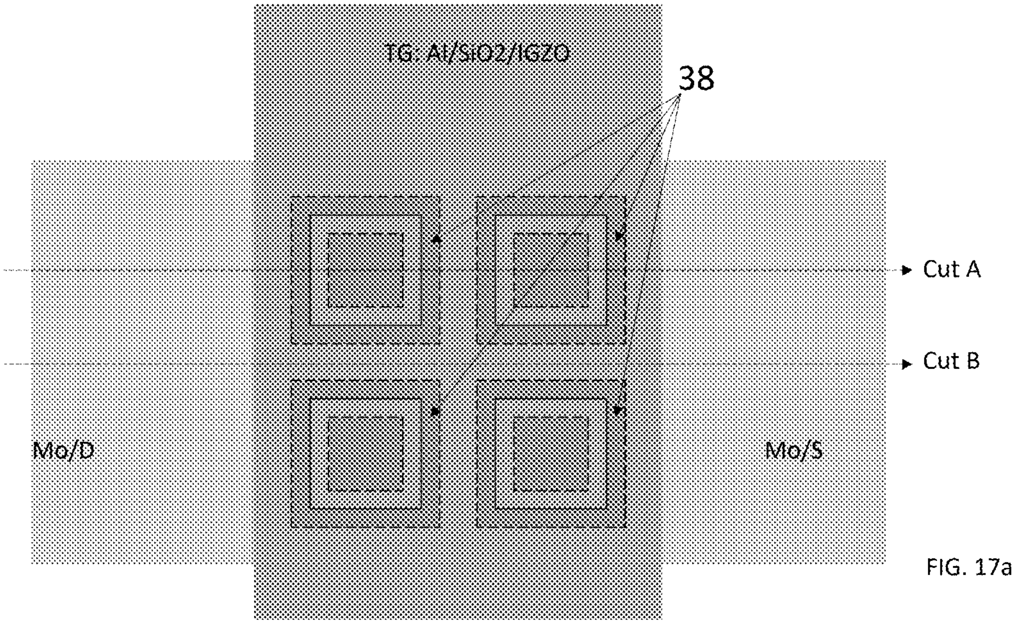
FIG. 17 (consisting of FIGS. 17*a*-17*c*) illustrates a top view of an example embodiment of a dual gate vertical TFT structure relative to the layer stack with multiple via holes and partial etching of the source electrode.
Figure 17B:
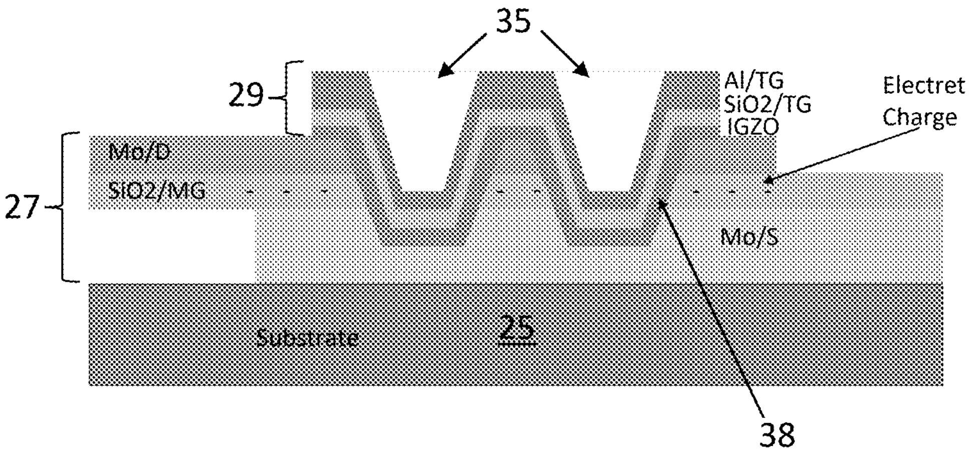

In a further example embodiment in accordance with the present invention, at least one additional via hole 35 may be provided in the first layer stack 27 exposing the first conductor layer 30, the first insulator layer 32, and the second conductor layer 34. For example, two or more via holes may be provided as shown in FIG. 12, and those skilled in the art will appreciate that more than two via holes 35 may be provided, as shown in FIGS. 17*a* and 17*b*. Further, although the via hole or via holes 35 are shown in the form of a square with four inward sloping side walls (see, e.g., FIGS. 17*a* and 17*b*), those skilled in the art will appreciate that the via holes 35 may take any shape or form, for example an irregular shape, a geometric shape, a rectangular shape, a square shape, a triangular shape, a circular shape, an oval shape, or the like.

FIGS. 11*a*-11*d* show graphical representations of turn on voltage for various vertical TFT structures. In FIG. 11, the drain voltage for each structure is high (e.g., Vds=10 volts) which would shift Vth to negative (short channel effect). Vth will shift towards zero if Vds=0 volts. As discussed above, the via dual gate VTFT Type structure overcomes the short channel effect (L: Channel Length). Vth<0 when the channel (between Source and Drain) becomes short. For a depletion mode semiconductor such as IGZO, Vth is slightly negative for L~=2 um. In a particular example, for small L~=100 nm and Vds~=20V, Vth shifts to ~-10V. FIG. 11 shows graphs of the Vth for various types of VTFT structures, including single gate (does not turn off at zero gate voltage), dual gate with both gates driven (higher on current, but turned on at zero gate voltage), dual gate with one gate biased (turns on/off at zero gate voltage), and dual gate with one gate over biased (turns on at high gate voltage). In FIG. 11, Ids=drain to source current, Vgs=gate to source voltage.

The via dual gate VTFT is easier to fabricate than a single gate VTFT with one active gate between the source and the drain (difficult to turn off current). A single gate VTFT requires an overhang (gate wider than the source and the drain electrodes) in order to turn off, which is difficult to fabricate.

It should be appreciated that either or both of the first insulator layer 32 and the second insulator layer 40 may comprise an insulator stack consisting of multiple layers of insulators. The term "insulator stack" is used herein to denote an insulator layer 32, 40 having at least one insulator layer.

FIG. 12 shows an example embodiment of the via forming method used to construct the dual gate vertical TFT of FIG. 10*a* using an etching process. Such a method may comprise depositing a substrate layer, a first layer stack, and a second layer stack. In Step 1 of the process shown in FIG. 12, the first layer of the first layer stack may be formed by depositing a first conductor layer on the substrate layer to form a source electrode, and patterning the source electrode with a photoresist (PR1) as shown. In Step 2, a first insulator stack is deposited on the first conductor layer to form a mid-gate, and a second conductor layer is deposited on the first insulator layer to form a drain electrode. The first insulator stack may be formed by first depositing a mid-gate insulator layer, followed by a conductor layer and a further insulator layer. The first insulator stack and the second conductor layer are then patterned with a further photoresist (PR2). In Step 3 of the process, a further photoresist (PR3) is used to pattern the first layer stack to form one or more via holes 35 in the first layer stack exposing at least portions of the first conductor layer, the first insulator stack, and the second conductor layer using an etching process. The exposed metal layer in the mid-gate is then insulated with an oxide after the via hole is formed. In Step 4 of the process, the second layer stack may be formed by depositing a semiconductor layer making electrical contact with the source electrode and the drain electrode, forming a substantially vertical channel in the via hole between the source electrode and the drain electrode across the mid-gate, depositing a second insulator stack forming a top-gate insulator on the semiconductor layer, and depositing a third conductor layer forming a top-gate electrode on the second insulator layer. Another photoresist (PR4) is then placed in the via holes and the second layer stack is etched to produce the top-gate as shown.

The same process as shown in FIG. 12 can be used to fabricate the VTFT of FIG. 10*b*, except that in Step 4 there is no third conductor layer deposited on the second insulator stack. Rather, the second insulator layer comprises a charged electret.

Figure 13:
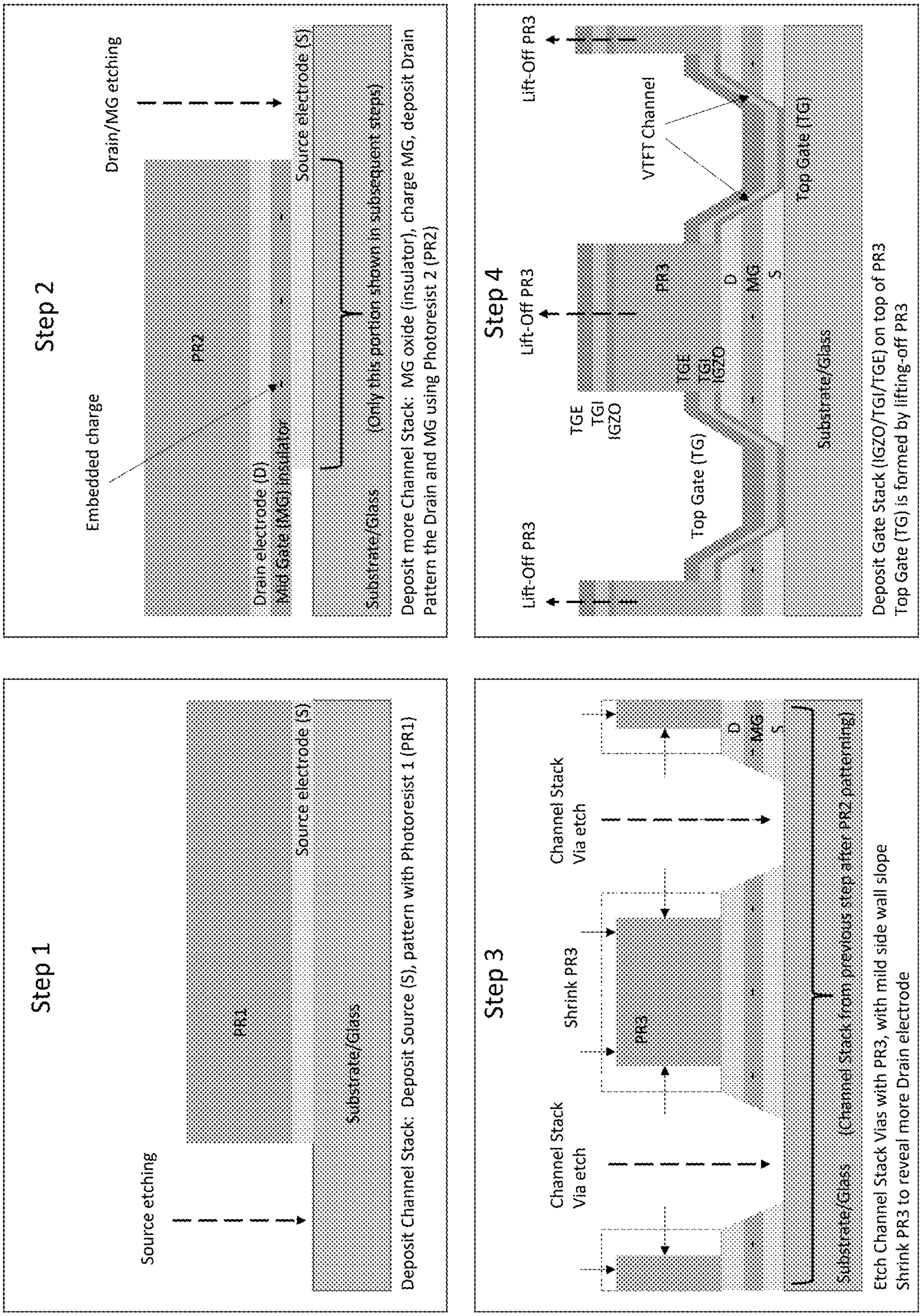
FIG. 13 shows an example embodiment of the via forming technique used to construct the vertical TFT of FIG. 10*c* (a passive mid gate version that is charged up as an electret, where the top gate is formed utilizing a lift-off process)

FIG. 13 shows an example of the via forming process for constructing a dual gate VTFT as shown in FIG. 10*c* using a lift-off process. It should be appreciated that the passive mid-gate may be a charged electret. Further, the semiconductor layer, the gate insulator, and gate electrode (e.g., Al), are all patterned together by deposition and lift off, not by etching. These layers are also self-aligned to the source and drain. In Step 1 of such an example embodiment, a layer of conductor forming the source electrode may be deposited and optionally patterned (e.g., using photoresist PR1) onto a substrate layer (e.g., glass). In Step 2, a layer of an insulator material (e.g., a dielectric material) may be deposited and optionally electrically charged forming a mid-gate. Charging of the mid-gate insulator can be accomplished by embedding a charge into the dielectric material by corona discharge, by DC biased sputter deposition, or by any of the known methods that create an electret. A further conductor layer forming the drain electrode may be deposited and optionally patterned on the layer of insulator material with an overlap with the source electrode layer. An etch mask (a photoresist or other sacrificial material, e.g., photoresist PR2) may be deposited and optionally patterned in the layer stack with an opening in the overlap area between the source and drain electrode. As shown in Step 3, one or more via holes (openings) may be patterned (e.g., using photoresists PR3) in the first layer stack by an etching process. The via holes may be U-shaped or V-shaped channels, or take almost any form or shape. The via holes may penetrate through the first layer stack to the top of the substrate layer and be formed with inward sloping side walls. The photoresist PR3 can then be shrunk to reveal a portion of the drain electrode. As shown in Step 4, once the via holes are formed and PR3 is shrunk, a semiconductor layer (e.g., IGZO, silicon, or other organic or inorganic semiconductor materials), a gate insulator, and a gate electrode, respectively, may then be deposited with the shrunken photoresist PR3 remaining in place. The photoresist PR3 can then be lifted off to remove unwanted materials outside the via opening to form the channel and the top gate. The result is a dual gate vertical TFT configuration having a vertical channel between the source electrode and the drain electrode separated by the mid-gate insulator, with the mid gate electrically charged as an electret. Such an arrangement has the advantage of mitigating the short channel effect when the source and drain electrodes are closer to one another.

The insulator may be the passive mid gate, electrically charged (e.g., forming an electret: a charge embedded into a dielectric material) during its deposition or after its deposition. The charge may be negative or positive (to control the threshold voltage, Vth).

Figure 14:
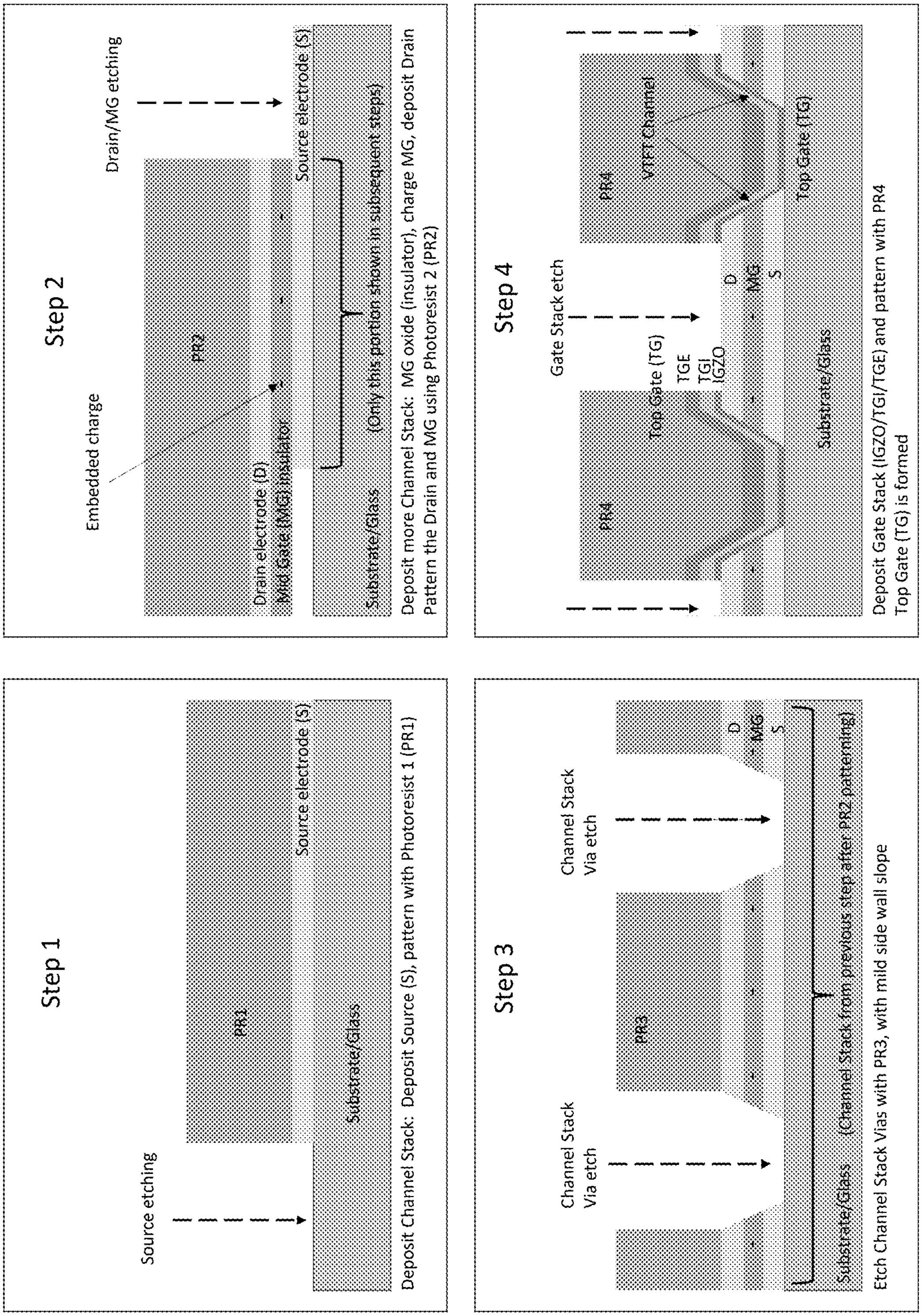
FIG. 14 shows further example embodiment of the via forming technique used to construct the vertical TFT of FIG. 10*c* without utilizing a lift-off process.
Figure 15:
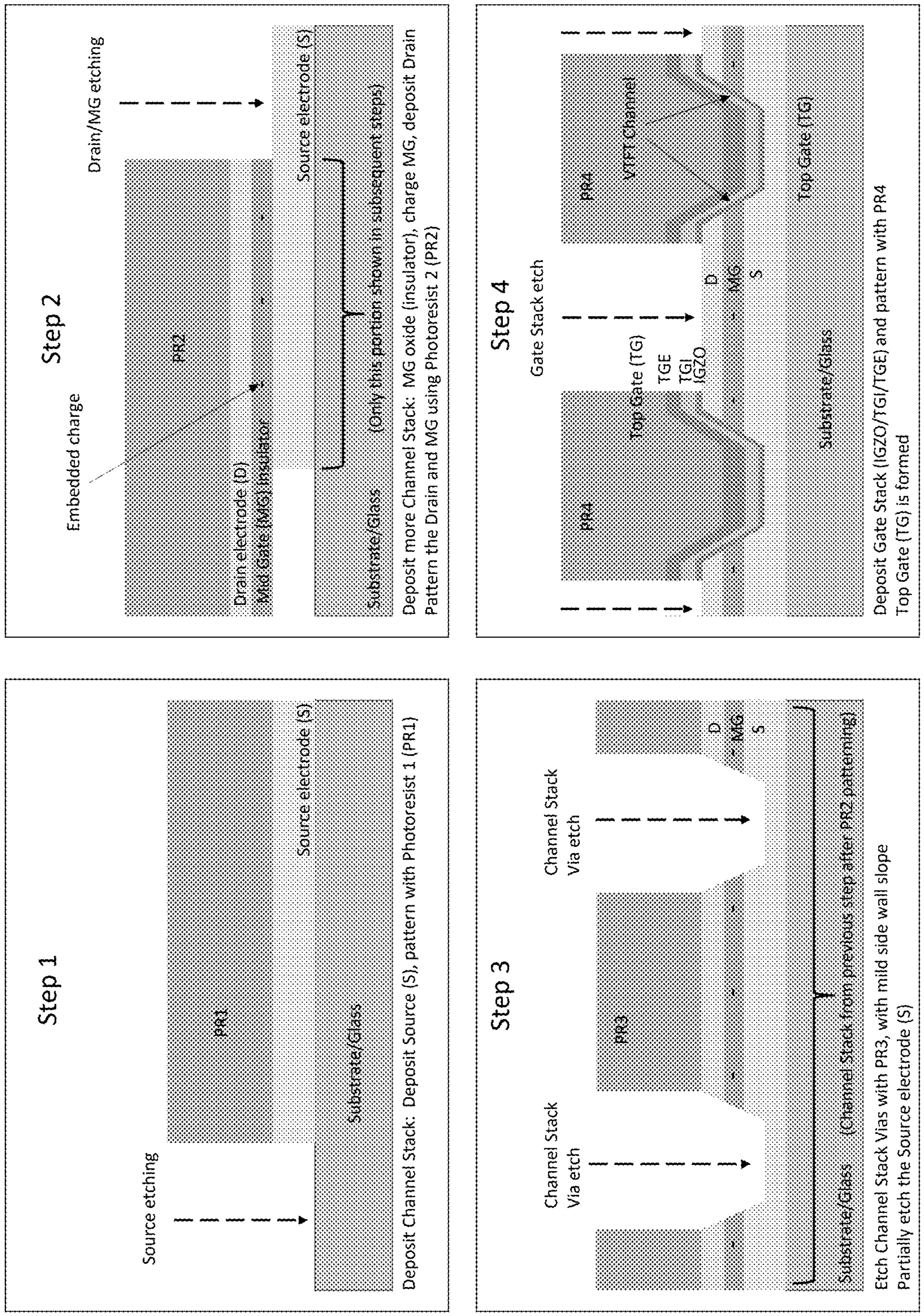
FIG. 15 shows and example embodiment of the via forming technique used to construct the vertical TFT of FIG. 10*d*, without utilizing a lift-off process.

FIGS. 14 and 15 show example embodiments of the via forming technique used to construct a dual gate vertical TFT with a passive mid gate as shown in FIGS. 10*c* and 10*d*, respectively. In FIGS. 14 and 15, the top gate 41 is formed by etching without utilizing a lift-off process. The processes shown in FIGS. 14 and 15 are similar to those described above in connection with FIG. 12, except that the first insulator stack does not include the conductor layer between insulator layers. Instead, the first insulator stack is electrically charged to form an electret mid-gate. Further, FIG. 12 shows the via hole etching through the first layer stack and up to the top of the substrate layer (as in FIG. 10*c*), while FIG. 15 shows the via hole etching only extending partially into the first conductor layer (as in FIG. 10*d*).

The methods may also include additional features and functionality of the dual gate TFTs described above.

Figure 16A:
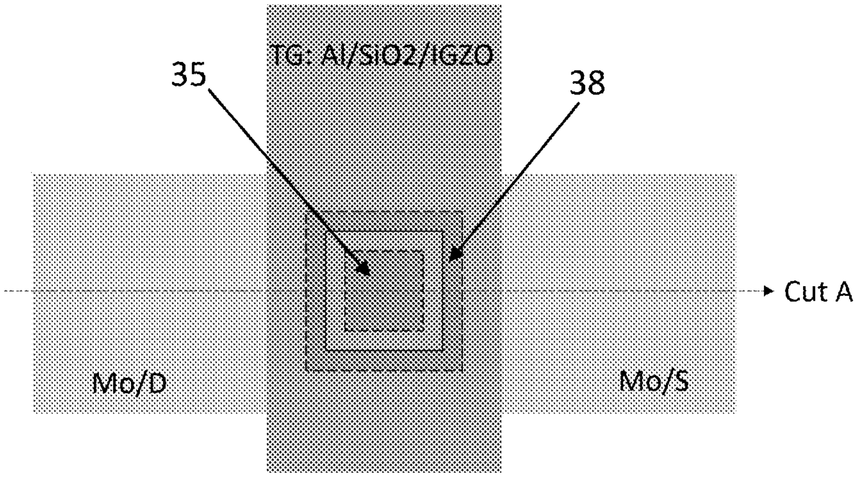
FIG. 16 (Consisting of FIGS. 16*a* and 16*b*) illustrates a top view of an example embodiment of a dual gate vertical TFT structure relative to the layer stack.
Figure 16B:
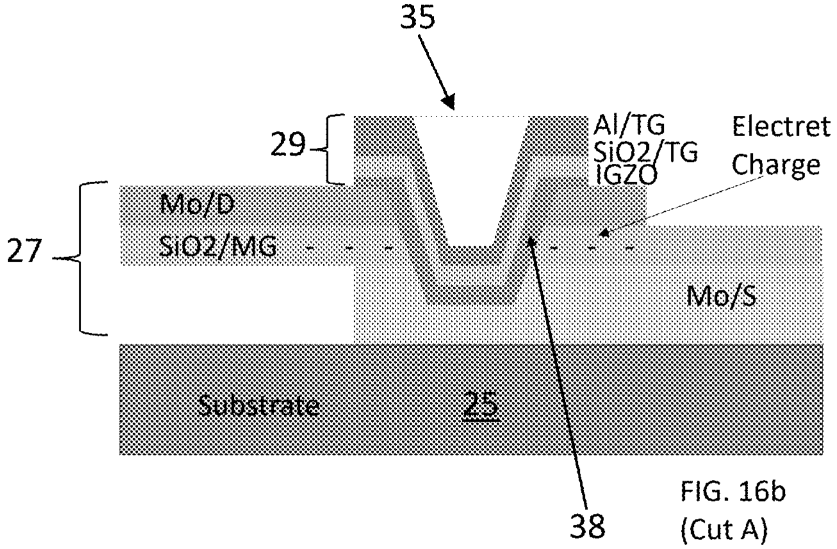
Figure 17C:
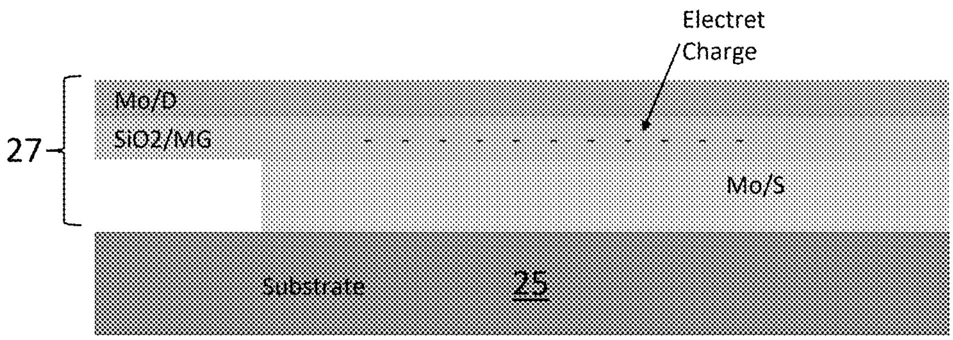

FIGS. 16*a* and 16*b* illustrate top and side section views, respectively, of an example embodiment of a dual gate vertical TFT structure relative to the layer stacks 27 and 29 with a single via hole. FIGS. 17*a*-17*c* illustrate top and two side section views, respectively, of an example embodiment of a dual gate vertical TFT structure relative to the layer stacks 27, 29 with multiple via holes 35 and partial etching of the source electrode 30. In the embodiments shown in FIGS. 16*a*, 16*b*, 17*a*, and 17*b*, a mask for forming the via hole 35 is aligned with one or more masks used for forming the second layer stack 29. This results in a via hole 35 having four inward sloping side walls. In embodiments with multiple via holes 35 such as shown in FIG. 17*a*, a longer total channel width is provided so that more current can be handled.

Figure 18A:
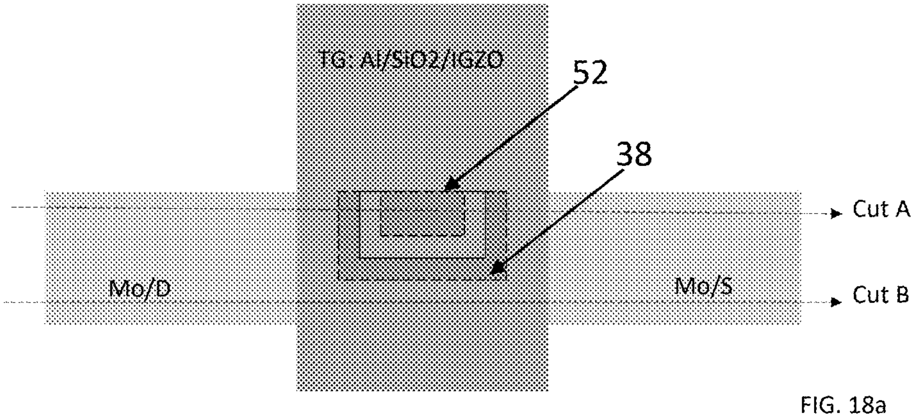
FIG. 18 (consisting of FIGS. 18*a*-18*c*) illustrates a top view of an example embodiment of a dual gate vertical TFT structure relative to the layer stack where only a partial via hole is formed due to only partial overlap of via hole and first layer stack patterning.
Figure 18B:
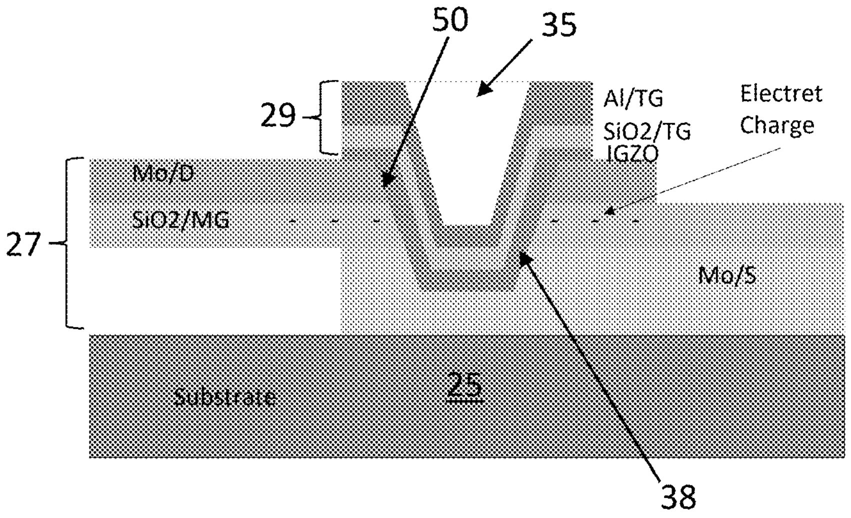
Figure 18C:
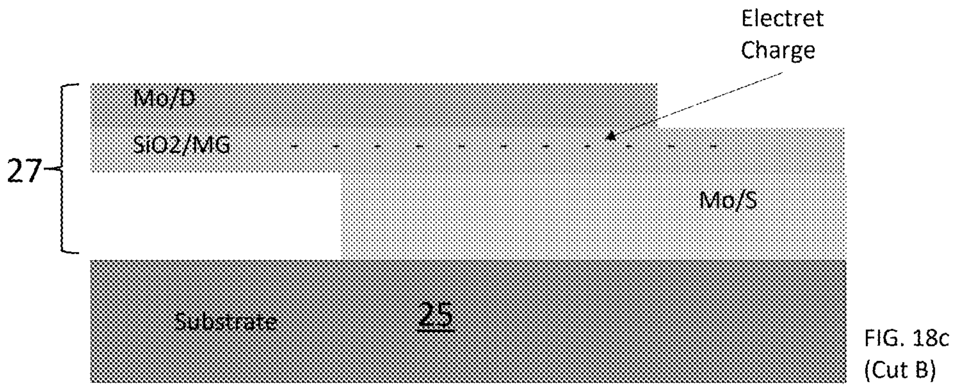

FIGS. 18*a*-18*c* illustrate top and two side section views, respectively, of an example embodiment of a dual gate vertical TFT structure relative to the layer stacks 27 and 29 with only partial etching of the first layer stack 27, and where only a partial via hole 35 is formed due to only partial overlap of via 35 and first layer stack patterning. For example, a mask for forming the via hole 35 may be offset with one or more masks used for forming the second layer stack 29. This results in a vertical sidewall 52 in areas where there is no overlap and inward sloping sidewalls 50 in the areas of overlap. Such a via hole 35 resulting from a partial overlap would make the device size smaller at the expense of narrower channel width. However, the channel length is still determined by the spacing between the source 30 and the drain 34 which is separated by the mid-gate 32.

The via forming methods discussed herein may also be used to fabricate a self-aligned LTFT without additional process steps, as discussed in detail below.

Figure 19:
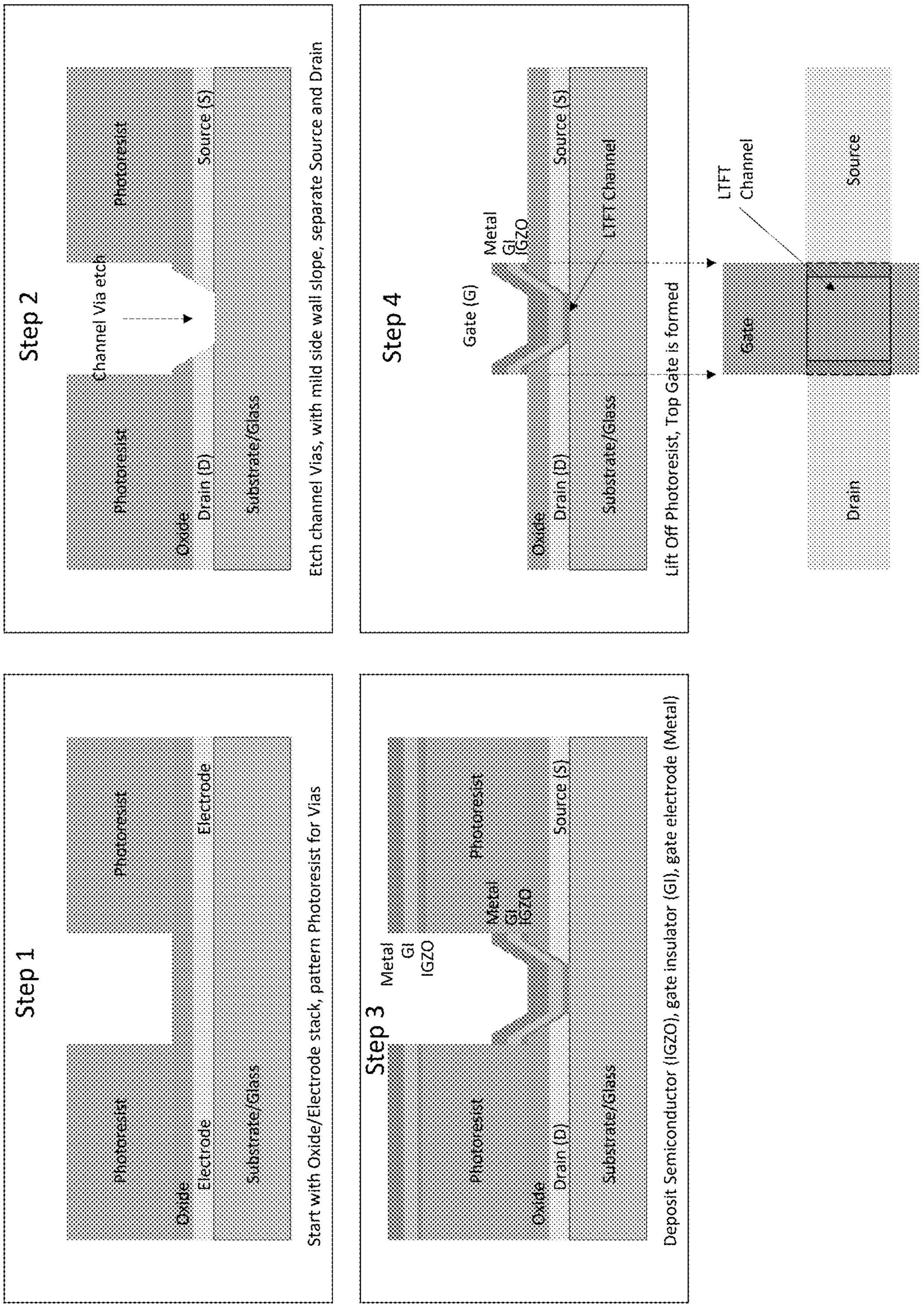
FIGS. 19 and 20 show example embodiments of the via forming technique used to construct lateral TFTs that can co-exist with the vertical TFT using the same processing steps.
Figure 20:
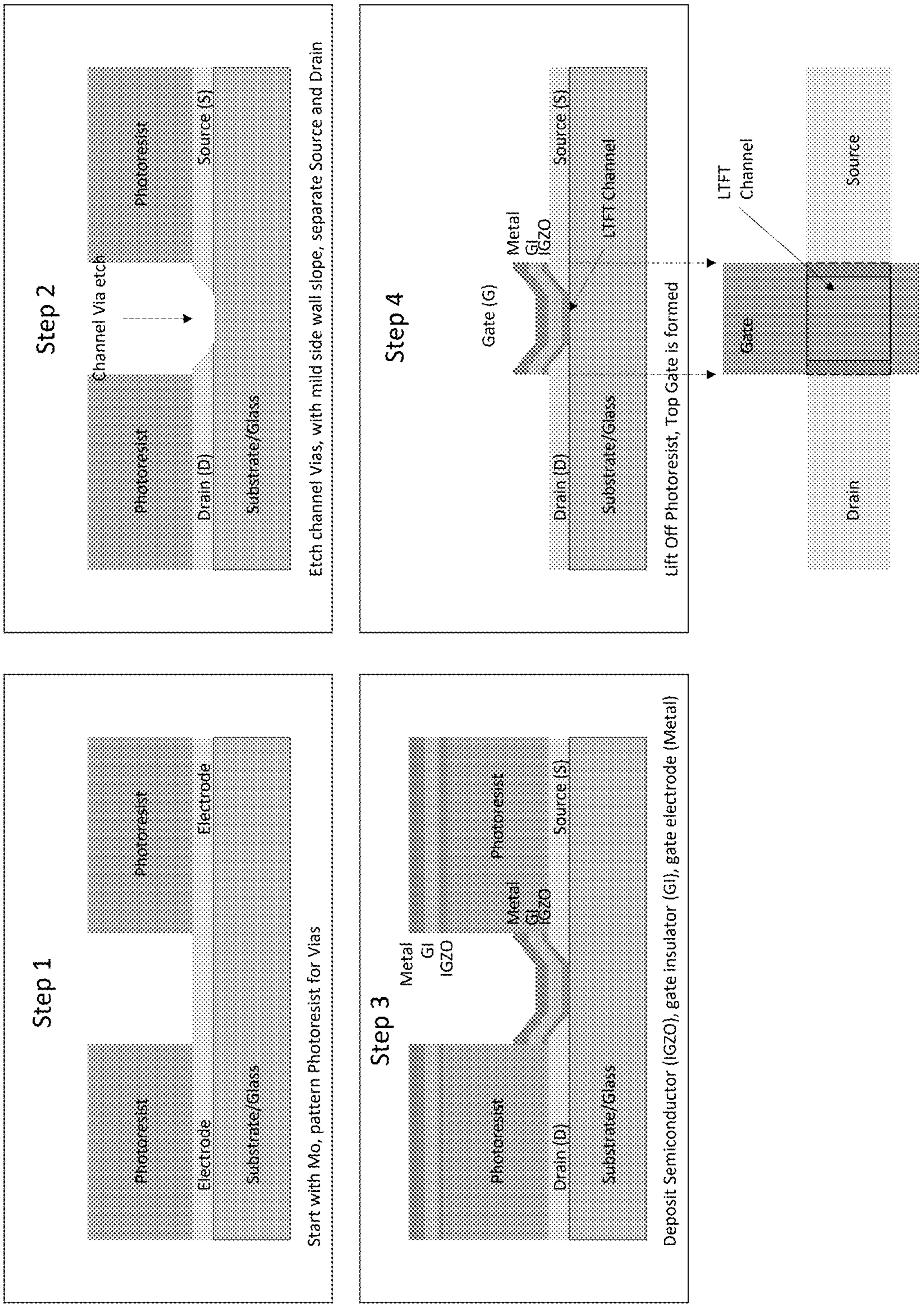

FIGS. 19 and 20 show example embodiments of the via forming process for constructing lateral TFTs (LTFT). The process can be used to fabricate a self-aligned LTFT without additional process steps. As shown in Step 1 of FIGS. 19 and 20 an electrode (conductor) layer is deposited on top of a substrate layer. An etch mask (e.g., photoresist 1 or other sacrificial material) is then deposited over the electrode layer with an opening (via hole). As shown in Step 2, the via patterning can be used to divide the electrode layer to form laterally arranged source and the drain electrodes. Once the via hole is formed using the photoresist and etching process, a semiconductor layer (e.g., IGZO, silicon, or other organic or inorganic semiconductor material), gate insulator, and gate electrode can be respectively deposited into the via hole as shown in Step 3. The unwanted deposition on top of the photoresist is lifted off to form the channel and the gate electrode, as shown in Step 4. The result is a top gate lateral TFT configuration having a lateral channel between the source and the drain electrode where the gate is on top of the channel.

FIG. 19 shows an embodiment of an LTFT that can be fabricated using the same process steps for the VTFT shown in FIG. 13. There is a mid gate oxide layer above the electrode layer that is not needed for operation. This mid gate oxide is a leftover from the VTFT formation using the process steps in FIG. 13, if the mid gate oxide is not patterned.

FIG. 20 shows an embodiment of an LTFT without the mid gate oxide layer of FIG. 19. This can result if the mid gate is patterned in process steps in FIG. 13, or if an LTFT only process steps were employed.

In the embodiments discussed above, the "lift off" process involves etching or removing the etch mask material with other materials on top of the etch mask. For example, a very thick photoresist in the order of 1 to 2 um in thickness can be dissolved or etched or ashed (plasma etch or descum), removing the unwanted material deposited on top of the photoresist. This leaves the channel and the top gate in place within the opening. The semiconductor and the gate insulator plus the gate electrode would typically add up to only 100 to 300 nm, a very small fraction of the photoresist (sacrificial layer) so that the etchant can get in and dissolve the photoresist completely.

Figure 21A:
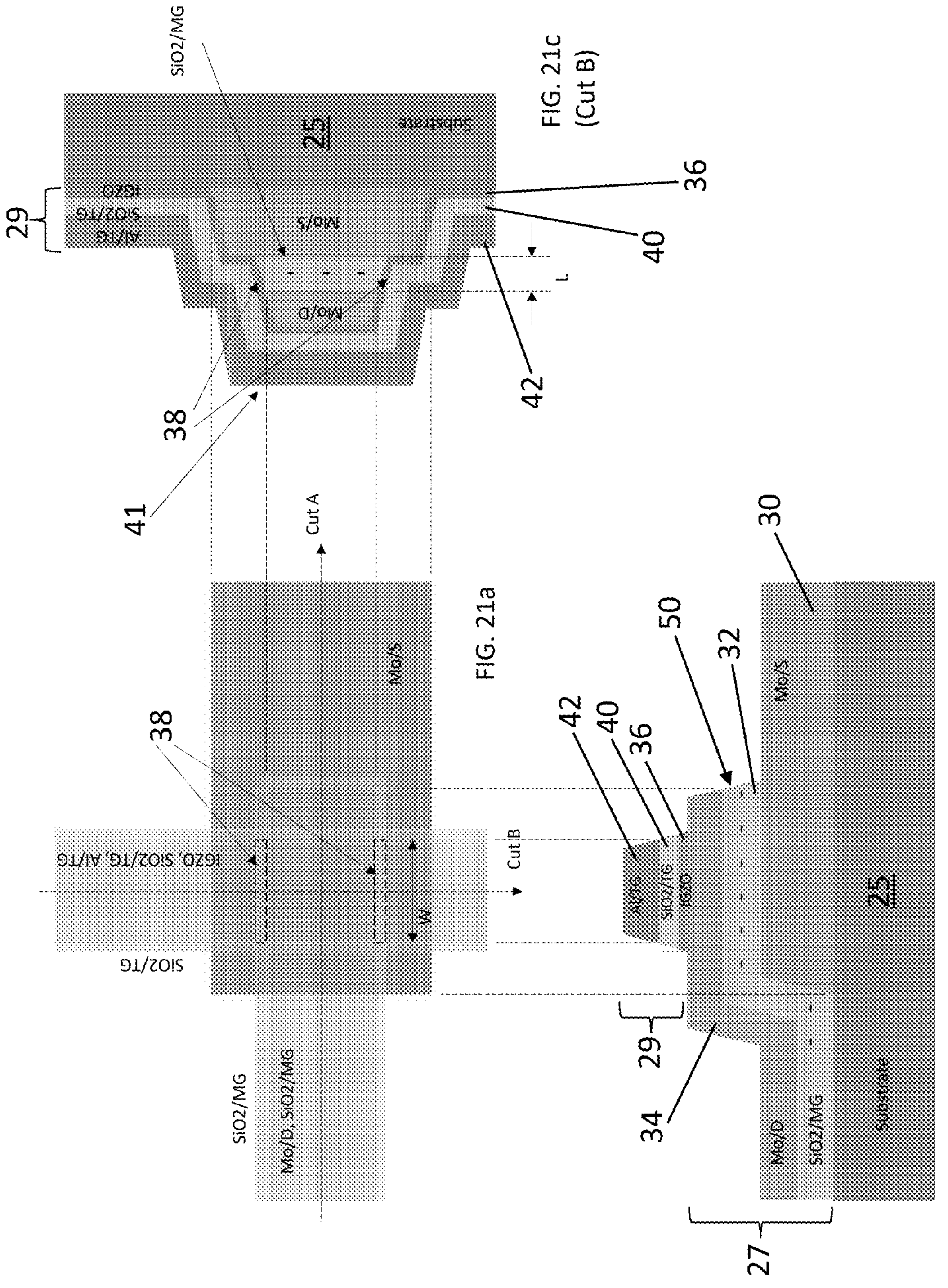
FIG. 21 (consisting of FIGS. 21*a*-21*c*) shows an alternate embodiment of a vertical TFT without any via holes.

FIGS. 21*a*-21*c* show an alternative embodiment of vertical TFT without any via holes. This vertical TFT shown in FIGS. 21*a*-21*c* can be built using the same processing steps as set forth above in connection with the vertical TFT embodiments having one or more via holes, but without the one mask step that patterns the via hole(s). The patterning of the first layer stack 27 may result in sloped side walls 50 on an outside of at least the first insulator layer 32 and the second conductor layer 34. Alternatively, the patterning of the first layer stack 27 may result in sloped side walls on an outside of each of the first conductor layer 30, the first insulator layer 32 and the second conductor layer 34. In either embodiment, the substantially vertical channel 38 is formed on the outside of the first layer stack 27.

By patterning the drain electrode 34 and the first insulator layer 32 (mid-gate) with a side wall slope (e.g., approximately 30 to 45 degrees), the vertical channel 38 can be formed across the outside edges of the first insulating layer 32 (mid-gate), rather than an inside edge of a via hole within the drain electrode. IGZO or other semiconductor materials such as amorphous silicon (a-Si) coats over the side wall of drain electrode (e.g., Mo shown), mid-gate oxide (e.g., $SiO_2$ shown), and source electrode (e.g., Mo shown). The channel 38 is formed between the drain and the source across the charged mid-gate 32. In the example shown in FIG. 21*c*, two such channels are formed, one on either side of the drain electrode 34. It is possible to just have a channel on one side if the top gate stack 29 partially overlaps the drain electrode 34. FIG. 21*b* and FIG. 21*c* show two different cross-sectional views along the cut lines A and B of FIG. 21*a*.

As long as the source and the drain electrodes are parallel to each other and placed on a separate plane, many possibility exist in forming a vertical channel between the source and the drain. According to the present invention, the mid-gate 32 separates the source 30 and the drain 34. Together they form the first layer stack 27. In the embodiment shown in FIGS. 21*a*-21*c*, the channel 38 is formed on the outside edges of the drain electrode 34, mid-gate 32, and the source electrode 30.

The drain electrode 34 and the mid-gate insulator 32 are patterned until the etching stops at (or extends partially into) the source electrode 30. This patterning exposes the top and the side of the drain electrode 34, the side of the mid-gate insulator 32, and the top of the source electrode 30. The second layer stack 29 is deposited next. A semiconductor layer 36 (e.g., IGZO), is followed by the top-gate insulator 40 and the top-gate electrode 42. The semiconductor layer 36 makes electrical contact with the top and the side of the drain electrode 34, insulating contact with the exposed side of the mid-gate insulator 32, and electrical contact with the top of the source electrode 30. This forms the VTFT channel 38.

Subsequently, the top-gate stack (second layer stack 29) is patterned to form the top-gate 41, consisting of the semiconductor layer 36, top-gate insulator 40, and the top-gate electrode 42. In FIG. 21*a*, two substantially vertical channels 38 are formed, on either side of the drain electrode 34 where the top-gate overlaps 41.

If the top gate 41 overlaps only partially with the drain electrode 34 and does not cross the drain electrode 34, then only one vertical channel 38 will form.

The vertical channel 38 can be significantly shorter than a channel that can be formed laterally. The thickness of the mid-gate 32 determines the channel length, L (typically about 100 nm). The width of the channel, W, is determined by the width of the top-gate stack 29. W is limited by the lithography, typically around 2 um.

Isolating the semiconductor layer 36 around the channel area is optional and will require an extra mask and patterning step.

The mid-gate 32 may be electrically charged either during or after the deposition in order to compensate for the short channel effect when the channel is short. It should be noted that the short channel effect occurs when the drain voltage is sufficiently high to turn on the semiconductor channel, rather than the gate voltage turning it on. This typically happens when the source to the drain distance is in the similar order of magnitude as the gate to semiconductor distance, e.g. the gate insulator thickness. With the present invention, the gate insulator thickness is around 50 nm. The mid-gate thickness is around 100 nm. Thus, a high drain voltage can turn on the channel. This is the reason that the turn on threshold voltage, Vth, shifts to a negative value for a n-type transistor. An active or passive mid-gate can negate this shift.

Figure 22A:
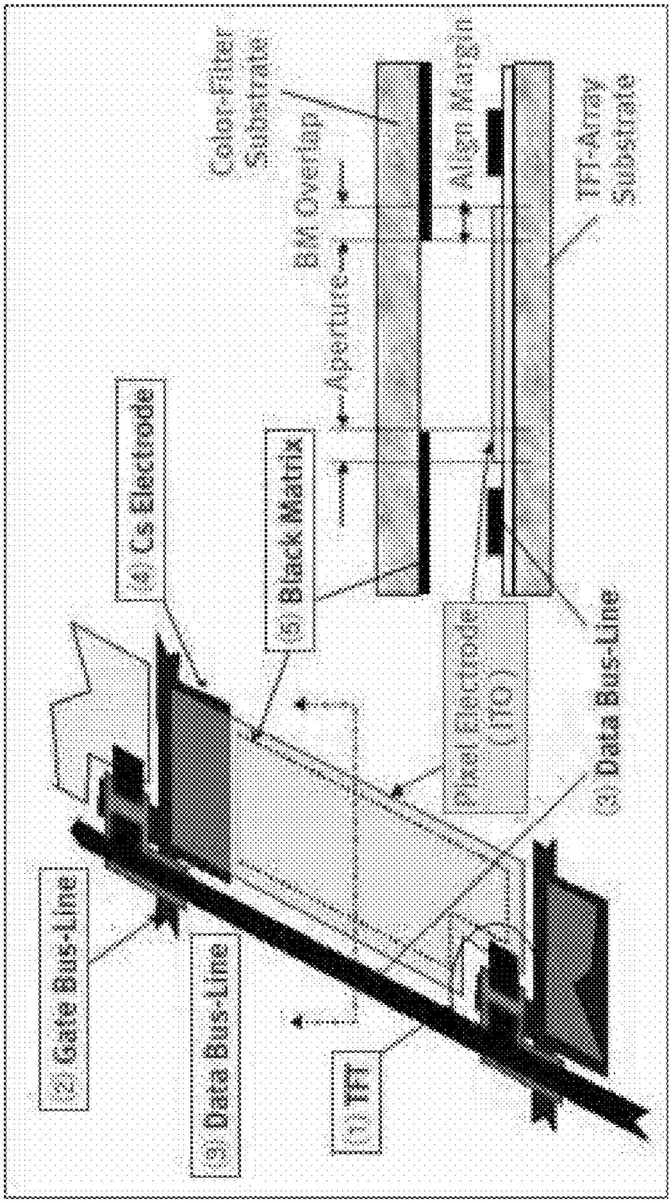
FIG. 22a (Prior Art)
FIG. 22*a* shows a prior art AMLCD pixel layout.

The source electrode (Mo shown) can be other material, for example ITO (Indium Tin Oxide) which is a transparent conductor often used in display applications. The vertical TFT shown in FIGS. 21*a*-21*c* can be used in the fabrication of an AMLCD pixel design. FIG. 22*a* shows a prior art AMLCD pixel layout using an LTFT. As shown in FIG. 22*a*, a conventional Active Matrix LCD display panel uses a TFT backplane to control the pixel voltage, which modulates the liquid crystal and changes its polarization. The array of TFT transistors are addressed in row and column mode. The row drives the gate line that connects to all the gate electrodes of the TFTs on that selected row. Columns lines provide the voltage (data) to be stored on each pixel. Each pixel has a storage capacitor. All current AMLCD TFT backplanes use Lateral TFTs (LTFT). Replacing them with VTFTs constructed in accordance with the present invention will speed up the charging of storage capacitors, which is required as the number of pixels increases and the refresh frame rate increases.

Figure 22B:
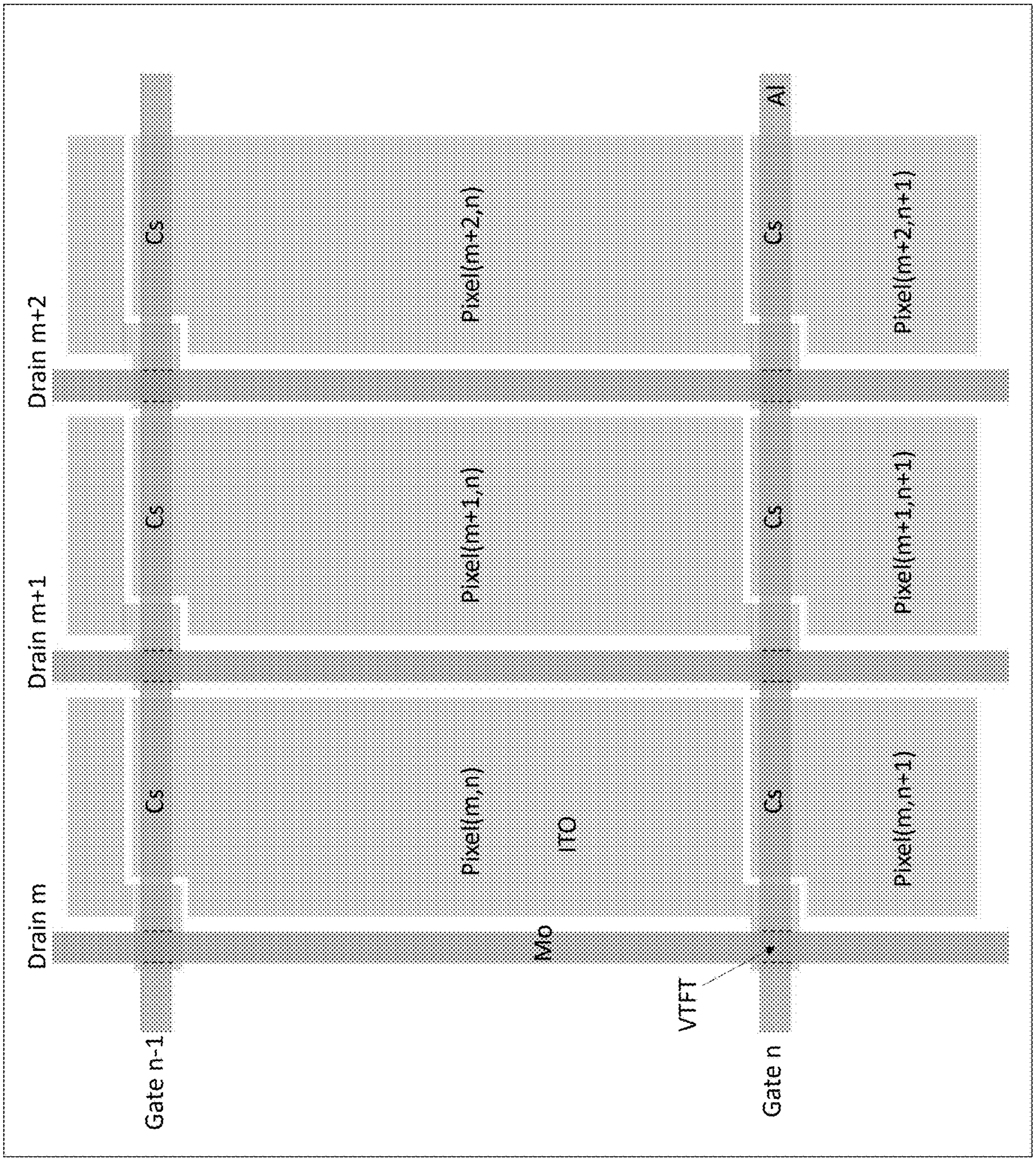
FIG. 22*b* shows an example embodiment of an AMLCD pixel layout utilizing a VTFT in accordance with FIG. 21*a;*

The Active Matrix TFT backplane can be designed using a dual gate VTFT in accordance with the present invention. FIG. 22*b* shows an example of an AMLCD pixel layout using the VTFT of FIG. 21*a*. A VTFT can be more compact and take up less real estate than an LTFT. A simple intersection of the drain electrode (column/data bus-line) and the gate electrode (row/gate bus-line) forms the VTFT. No vias are required between different layers or electrodes. The source electrode can be part of the pixel electrode, usually a transparent conductor such as ITO (Indium Tin Oxide).

Figure 23:
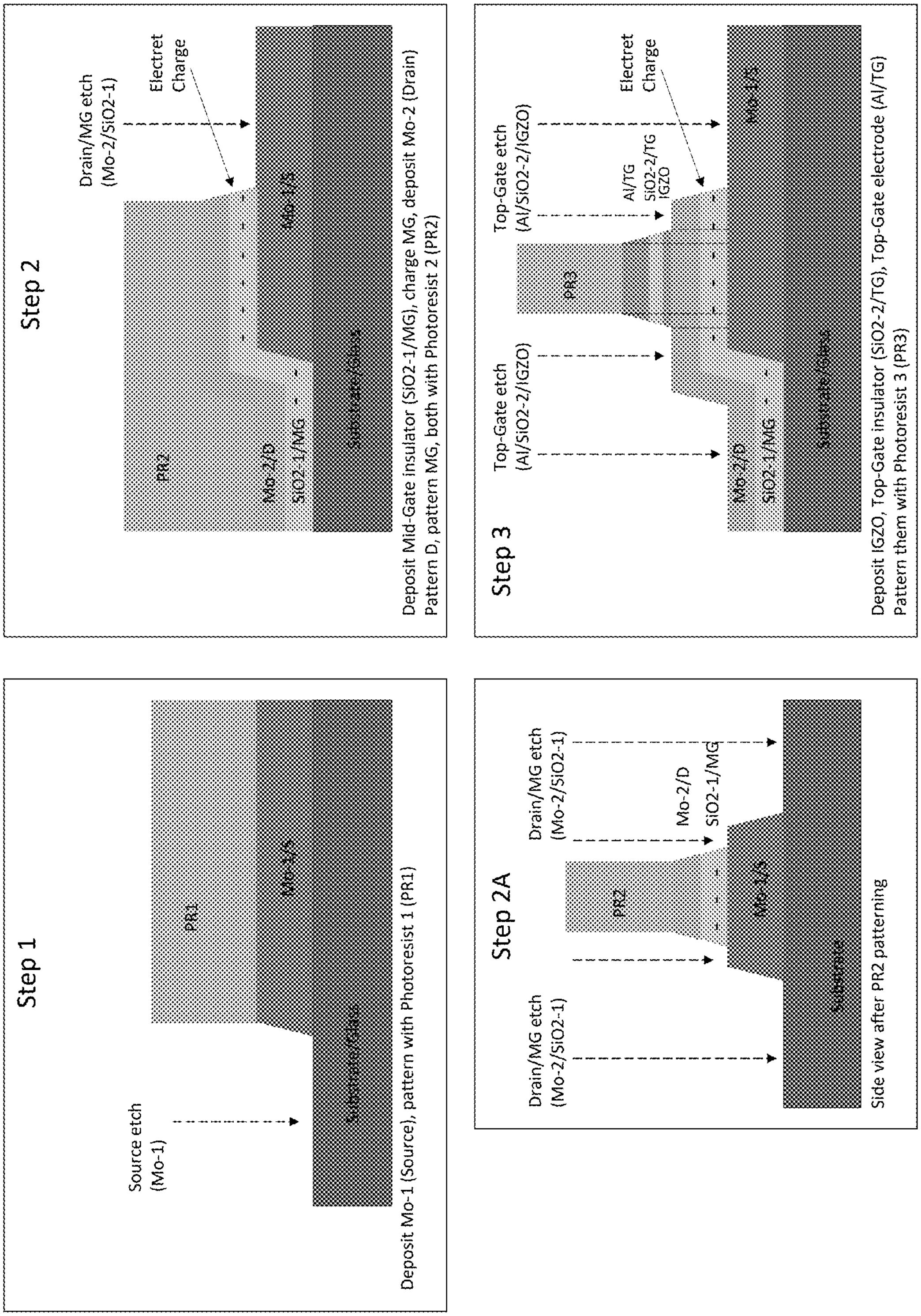
FIG. 23 shows an example embodiment of the technique used to construct the vertical TFT of FIG. 21.

The process flow diagram in FIG. 23 shows a 3-mask process for constructing the vertical TFT of FIG. 21*a* (without via holes), at least one mask less than that required for the vertical TFT of FIGS. 10*a*-10*e* fabricated using a via forming technique.

In Step 1, the first conductor layer is deposited on the substrate 25 and patterned by lithography using Mask 1 (photoresist PR1). This forms the source electrode 30. In this example, the conductor layer is Mo (Molybdenum) and labeled Mo-1.

In Step 2, a stack of insulator layers are deposited to form the mid-gate 32. In this example, the mid-gate 32 is shown as silicon dioxide, as SiO2-1. This can be a multi-layer stack consisting of different insulator material (e.g., SiO2/SiN/SiO2). The interface between different dielectric material is known to trap charges and retain them. The mid-gate 32 is electrically charged, either during the deposition, or after the deposition. This can be accomplished by the deposition tool parameters or by direct embedding such as corona discharge. This forms the electret mid-gate 32. The second conductor layer is deposited next (in the example shown Mo-2 is used) and becomes the drain electrode 34. The drain electrode 34 and the mid-gate 32 are patterned using Mask 2 (photoresist PR2). The etching process is controlled to produce a mild side wall slope on the drain 34 and the mid-gate 32 as shown at Step 2a (side view). This ensures the subsequent deposition, such as IGZO, would be continuous without breaking.

In Step 3, a semiconductor layer 36 (e.g., IGZO as shown), a top-gate insulator (e.g., SiO2 shown as shown), and the top-gate electrode 42 (e.g., Al as shown) are deposited. This forms the second layer stack 29 (top-gate stack). The second layer stack 29 is patterned to form the top-gate 41 using Mask 3 (photoresist PR3). Remaining IGZO underneath the top-gate maintains the electrical contact with the drain electrode, the mid-gate, and the source electrode which together forms the vertical channel 38.

If it is not desired to leave the IGZO underneath the top-gate routing, then optionally a further masking step can be used to create an IGZO island around the channel area.

As would be apparent to those skilled in the art, IGZO can be replaced with any semiconductor, including a-Si, LTPS, carbon nanotubes, organic semiconductor, a metal oxide semiconductor, or the like.

Figure 24A:
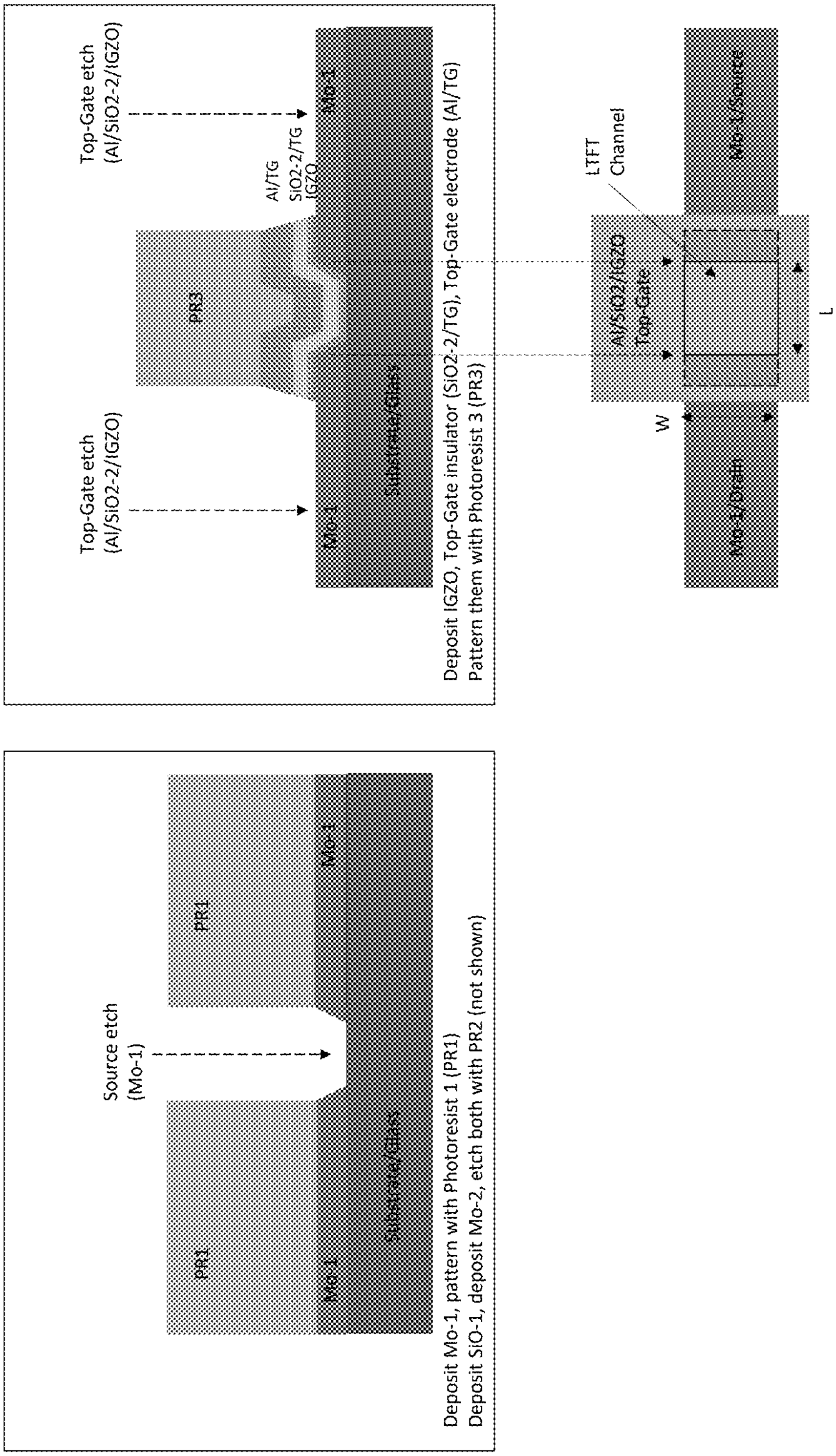
FIG. 24 (consisting of FIGS. 24*a* and 24*b*) shows example embodiments of processing steps used to construct lateral TFTs that can co-exist with the vertical TFT processing steps of FIG. 23.

The method discussed above in connection with FIG. 23 may also be used to fabricate a lateral thin film transistor (LTFT) without changing any of the process steps, as discussed in detail below. This depends on the design of the mask, with certain features removed. For example, in FIG. 24*a*, the first conductor layer (Mo-1) is patterned using photoresist PR1. The subsequent deposition of the mid-gate and the drain electrode are removed (etched away) using photoresist PR2 (not shown) to reveal Mo-1. The second layer stack is deposited with, for example, IGZO, SiO2-2, and Al. The second layer stack is patterned using photoresist PR3 to complete the top-gate structure for an LTFT. The LTFT channel is formed between Mo-1/Drain and Mo-1/Source. Typical dimensions for such an LTFT are L=2 um and W=2 um based on the lithographical limit.

Figure 24B:
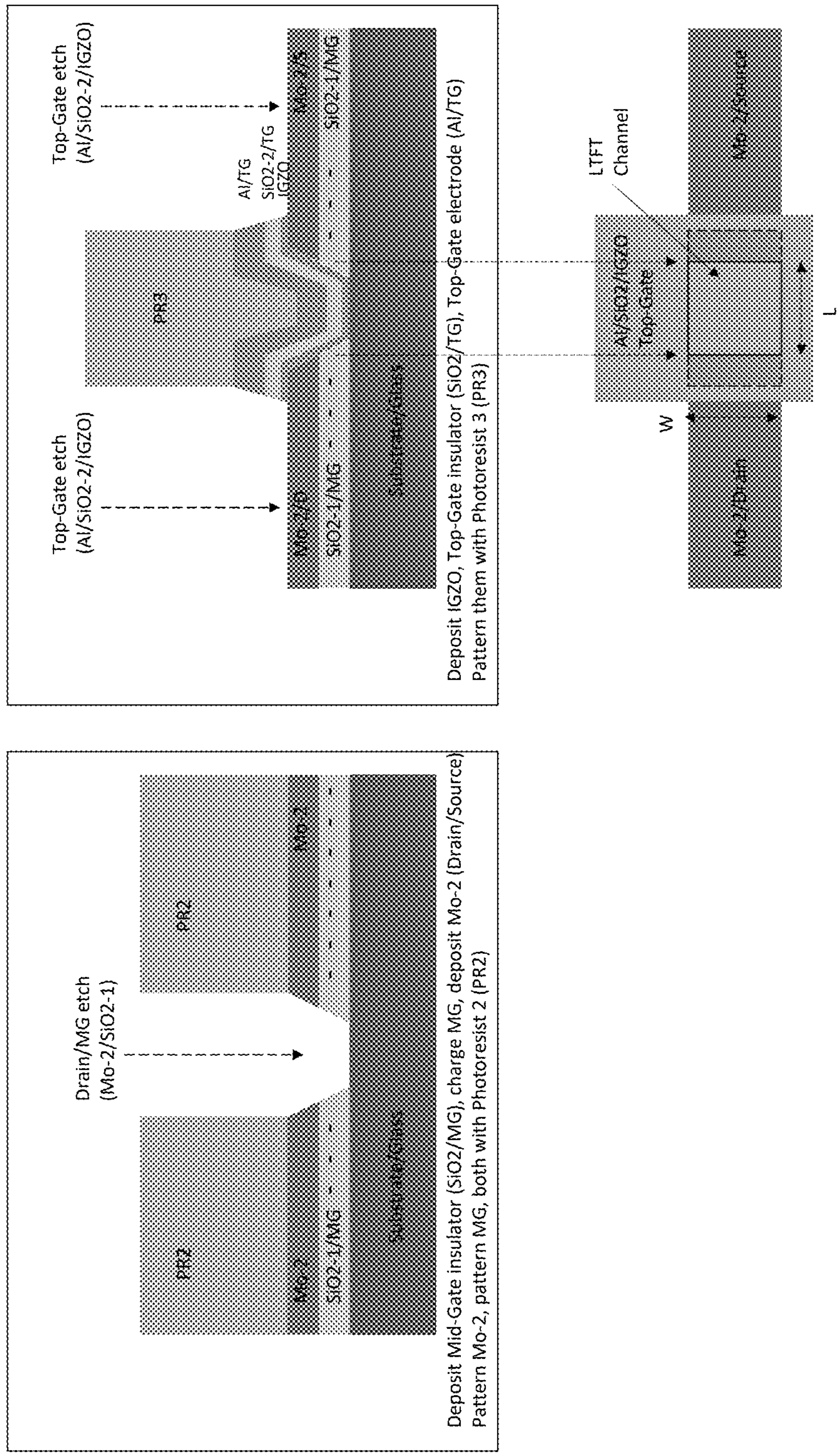

In FIG. 24*b*, the first conductor layer (Mo-1) is removed using photoresist PR1 (not shown). The subsequent deposition of the mid-gate and the drain electrode are patterned using photoresist PR2 to form the drain and the source electrodes on Mo-2. The second layer stack is deposited with, e.g., IGZO, SiO2-2, and Al. The second layer stack is then patterned using photoresist PR3 to complete the top-gate structure for the LTFT. The LTFT channel is formed between Mo-2/Drain and Mo-2/Source. Typical dimensions for LTFT are L=2 um and W=2 um based on the lithographical limit.

Although the invention has been described in connection with various illustrated embodiments, numerous modifications and adaptations may be made thereto without departing from the spirit and scope of the invention as set forth in the claims.

What is claimed is:

1. A method of fabricating a dual gate vertical TFT, comprising:

providing a substrate layer;

forming a first layer stack by:

depositing a first conductor layer on the substrate layer to form a source electrode;

depositing a first insulator layer on the first conductor layer to form a mid-gate;

depositing a second conductor layer on the first insulator layer to form a drain electrode;

wherein the layers of the first layer stack are patterned to expose at least portions of the first conductor layer, the first insulator layer, and the second conductor layer;

forming a second layer stack by:

depositing a semiconductor layer making electrical contact with the source electrode and the drain electrode, forming a substantially vertical channel between the source electrode and the drain electrode across the mid-gate;

depositing a second insulator layer forming a top-gate insulator on the semiconductor layer;

depositing a third conductor layer forming a top-gate electrode on the second insulator layer;

wherein the layers of the second layer stack are patterned to form a top-gate.

2. A dual gate vertical TFT, comprising:

a substrate layer;

a first layer stack comprising:

a first conductor layer deposited on the substrate layer forming a source electrode;

a first insulator layer deposited on the first conductor layer forming a mid-gate;

a second conductor layer deposited on the first insulator layer forming a drain electrode;

wherein the layers of the first layer stack are patterned to expose at least portions of the first conductor layer, the first insulator layer, and the second conductor layer;

a second layer stack comprising:

a semiconductor layer making electrical contact with the source electrode and the drain electrode, forming a substantially vertical channel between the source electrode and the drain electrode across the mid-gate;

a second insulator layer forming a top-gate insulator;

a third conductor layer forming a top-gate electrode;

wherein the layers of the second layer stack are patterned to form a top-gate.

3. The dual gate vertical TFT in accordance with claim 2, wherein the substantially vertical channel is shorter than a minimum size pattern that can be formed laterally by lithography.

4. The dual gate vertical TFT in accordance with claim 2, wherein the mid-gate comprises an insulator material electrically charged to form a passive mid-gate.

5. The dual gate vertical TFT in accordance with claim 2, wherein the patterning of the first layer stack results in sloped side walls on an outside of at least the first insulator layer and the second conductor layer.

6. The dual gate vertical TFT in accordance with claim 2, wherein the patterning of the first layer stack results in sloped side walls on an outside of the first conductor layer, the first insulator layer and the second conductor layer.

7. The dual gate vertical TFT in accordance with claim 2, wherein the substantially vertical channel is formed on the outside of the first layer stack.

8. The dual gate vertical TFT in accordance with claim 2, wherein one of:

the mid-gate comprises an active gate and the top gate comprises an active gate;

the mid-gate comprises an active gate and the top gate comprises a passive gate; and the mid-gate comprises a passive gate and the top gate comprises an active gate.

9. The dual gate vertical TFT in accordance with claim 8, wherein:

the mid-gate comprises an active gate; and the active mid-gate comprises a conductor layer enclosed by an insulating material.

10. The dual gate vertical TFT in accordance with claim 8, wherein the passive gate comprises a multi-stack gate having multiple layers of insulators, one or more of the layers of insulators being electrically charged.

11. The dual gate vertical TFT in accordance with claim 2, wherein:

the first layer stack is patterned to form a via hole in the first layer stack; and the substantially vertical channel is formed inside the via hole.

12. The dual gate vertical TFT in accordance with claim 11, wherein the via hole is formed with inward sloping side walls.

13. The dual gate vertical TFT in accordance with claim 11, wherein the via hole penetrates the first layer stack at least partially into the source electrode.

14. The dual gate vertical TFT in accordance with claim 11, wherein the via hole penetrates through the first layer stack up to a top of the substrate layer.

15. The dual gate vertical TFT in accordance with claim 11, further comprising at least one additional via hole in the first layer stack exposing the first conductor layer, the first insulator layer, and the second conductor layer.

16. The dual gate vertical TFT in accordance with claim 11, the via hole comprises one of an irregular shape, a geometric shape, a rectangular shape, a square shape, a triangular shape, a circular shape, and an oval shape.

17. The dual gate vertical TFT in accordance with claim 11, wherein a patterning of the via hole partially overlaps with the patterning of the first layer stack.

* * * * *